(12) United States Patent
Suematsu et al.

(10) Patent No.: US 10,074,510 B2
(45) Date of Patent: Sep. 11, 2018

(54) INSPECTION SYSTEM AND INSPECTION IMAGE DATA GENERATION METHOD

(71) Applicant: EBARA CORPORATION, Tokyo (JP)

(72) Inventors: Kenichi Suematsu, Tokyo (JP); Shoji Yoshikawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 14/455,276

(22) Filed: Aug. 8, 2014

(65) Prior Publication Data

US 2015/0041646 A1 Feb. 12, 2015

(30) Foreign Application Priority Data

Aug. 9, 2013 (JP) .................................. 2013-166141
Sep. 25, 2013 (JP) .................................. 2013-198161

(51) Int. Cl.
*H01J 37/28* (2006.01)
*H01J 37/20* (2006.01)
*H01J 37/285* (2006.01)

(52) U.S. Cl.
CPC ............ *H01J 37/20* (2013.01); *H01J 37/285* (2013.01); *H01J 2237/20228* (2013.01)

(58) Field of Classification Search
CPC .......... H01J 27/263; H01J 37/20; H01J 37/26; H01J 37/28; H01J 2237/20228
See application file for complete search history.

(56) References Cited

U.S. PATENT DOCUMENTS

| 6,087,673 A | 7/2000 | Shishido et al. | |
| 6,184,526 B1* | 2/2001 | Kohama | H01J 37/28 250/310 |
| 7,091,486 B1* | 8/2006 | McCord | B82Y 10/00 250/306 |
| 2005/0045821 A1* | 3/2005 | Noji | G01N 23/225 250/311 |
| 2005/0194535 A1 | 9/2005 | Noji et al. | |
| 2011/0278452 A1* | 11/2011 | Nozoe | H01J 37/244 250/307 |

(Continued)

FOREIGN PATENT DOCUMENTS

| JP | S51-047563 B | 12/1976 |
| JP | H10-318950 A | 12/1998 |

(Continued)

*Primary Examiner* — Eliza Osenbaugh-Stewart
(74) *Attorney, Agent, or Firm* — Pearne & Gordon LLP

(57) ABSTRACT

An inspection system includes a TDI sensor that integrates amounts of secondary charged particles or electromagnetic waves along a predetermined direction at every timing at which a transfer clock is inputted and sequentially transfers the amounts of secondary charged particles or electromagnetic waves so integrated, and a deflector which deflects, based on a difference between an actual position and a target position of the inspection target, the secondary charged particles or electromagnetic waves directed towards the TDI sensor in a direction in which the difference is offset. The target position is set into something like a step-and-riser shape in which the target position is kept staying in the same position by a predetermined period of time that is equal to or shorter than a period of time from an input of the transfer clock to an input of the following transfer clock and thereafter rises by a predetermined distance.

5 Claims, 24 Drawing Sheets

(56) References Cited

U.S. PATENT DOCUMENTS

2012/0097848 A1* 4/2012 Lifshin ............... G02B 21/002
 250/307

FOREIGN PATENT DOCUMENTS

| | | |
|---|---|---|
| JP | H11-132975 A | 5/1999 |
| JP | 2002-208368 A | 7/2002 |
| JP | 2004-363085 A | 12/2004 |
| JP | 2005-249745 A | 9/2005 |
| JP | 2006-032412 A | 2/2006 |
| JP | 2006-324124 A | 11/2006 |
| JP | 2007-048686 A | 2/2007 |
| JP | 2012-119694 A | 6/2012 |
| JP | 2012-253007 A | 12/2012 |
| WO | 02/01596 A1 | 1/2002 |

* cited by examiner comparison example

INSPECTION SYSTEM AND INSPECTION IMAGE DATA GENERATION METHOD

BACKGROUND OF THE INVENTION

Technical Field

The present invention relates to a technology for generating inspection image data for inspection of a defect or the like in a pattern formed on a surface of an inspection target by irradiating the inspection target with charged particles or electromagnetic waves.

In addition, the present invention relates to a technology for generating inspection image data for inspection of a defect or the like in a pattern formed on a surface of an inspection target by irradiating the inspection target with charged particles.

Background Art

Inspection systems are widely known in which a secondary charged particle which is obtained according to the properties of a surface of an inspection target such as a semiconductor wafer or the like is detected by a TDI (Time Delay Integration) sensor by irradiating the inspection target with charged particles or electromagnetic waves, whereby a pattern or the like which is formed on the surface of the inspection target is inspected by using image data generated based on the results of the detection (for example, International Publication No. 2002/001596, Japanese Unexamined Patent Publication No. 2007-48686, Japanese Unexamined Patent Publication No. 11-132975). In this inspection method, the irradiation of the inspection target with charged particles or electromagnetic waves is carried out while moving the movable stage to which the inspection target is held. The TDI sensor has imaging devices which are arranged in a stack in a predetermined number of stages in a vertical direction (which coincides with the moving direction of the movable stage). Amounts of secondary charged particles are integrated in the vertical direction in synchronism with the input of a transfer clock by using the time delay integration method, and an integrated detection amount of secondary charged particles is transferred in synchronism with the input of a transfer clock. A transfer clock is inputted into the TDI sensor at intervals of time which is necessary for the movable stage to move a distance corresponding to one pixel of the TDI sensor, that is, a distance in which a moving amount of an image projected on to the imaging device equals one pixel (this distance is determined by a magnification of an optical system) on the premise that the movable stage moves at a constant speed. According to this method, the amount of secondary charged particles is integrated by the predetermined number of stages, and therefore, when the inspection target is moved even at a high speed, a fast image picking up becomes possible.

However, in reality, it is difficult to move the movable stage at a constant speed at all times. This problem is caused by various reasons including the accuracy with which the system is built up, friction generated between the movable stage and the fixing member (for example, a guide rail), the accuracy with which the movable stage is controlled, and the like. In case there is generated a variation in the moving speed of the movable stage, an image that is picked up by the TDI sensor deviates to the front or rear in relation to an ideal state in which no variation is generated in the moving speed of the movable stage. The EO correction technology is developed to correct such a deviation. The EO correction technology is a technology in which an image that is projected on to the TDI sensor is corrected in relation to its position by using a deflector based on information on a difference between coordinates of a target position of the movable stage that is determined in advance and coordinates of a measured actual position (for example, Japanese Unexamined Patent Publication No. 2012-253007, Japanese Unexamined Patent Publication No. 2012-119694, Japanese Unexamined Patent Publication No. 2004-363085).

Additionally, in the inspection system, when a variation is generated in an emission current from an electron source, the luminance of an electron image changes, as a result of which, the luminance of an image that is outputted becomes uneven, leading to a reduction in inspection accuracy. To cope with this problem, a technology is known in which the emission current is controlled to stay at a set value through a feedback control by monitoring the emission current (for example, Japanese Unexamined Patent Publication No. 2006-324124).

SUMMARY OF INVENTION

In the conventional EO correction technology, however, the coordinates of the target position of the movable stage are set so that the ideal constant speed movement is realized. The correction of the position of the projection image based on this setting is carried out in a cycle which is shorter than the cycle in which transfer clocks are inputted into the TDI sensor, and therefore, it results in the movement of the projection image in the vertical direction during exposure. Namely, the projection image moves continuously from a first position where the projection image is projected on to one pixel only to a second position where the projection image is projected on to a pixel only which lies adjacent to the pixel in the first position in the vertical direction. This means that the projection image that should ideally be kept in the first position gradually moves away from the ideal position (the first position) towards the second position. Because of this, there still remains room for improvement in the inspection accuracy in the conventional EO correction technology.

On the other hand, it is considered that a transfer clock is inputted into the TDI sensor every time a movement of the movable stage by one pixel is detected by measuring an actual position of the movable stage. According to this configuration, even though a variation is generated in the moving speed of the movable stage, it is ensured that a transfer clock is inputted into the TDI sensor every time the movable stage moves the distance corresponding to one pixel of the TDI sensor. However, when the moving speed of the movable stage varies, the time required for the movable stage to move the distance equal to one pixel varies. This means that the exposure time of the imaging device varies. The variation in exposure time affects the accuracy of the image data. Specifically, a transferred detection value that results from a detection of secondary charged particles during a relatively short period of exposure exhibits a luminance value that is lower than the luminance value that the detection value is supposed to have, whereas a transferred detection value that results from a detection of secondary charged particles during a relatively long period of exposure exhibits a luminance value that is higher than the luminance value that the detection value is supposed to have. Namely, unevenness in luminance that is independent from the pattern formed on the surface of the inspection target is generated in the direction in which the movable stage moves. The generation of such unevenness in luminance leads to a reduction in inspection accuracy.

According to an aspect of the invention, an inspection system is provided. This inspection system includes a primary optical system that sheds either of charged particles and electromagnetic waves in the form of a beam, a movable unit that can hold an inspection target to move the inspection target through a position where the beam is shed by the primary optical system in a predetermined direction, a TDI sensor that integrates amounts of secondary charged particles or electromagnetic waves that are obtained by shedding the beam on to the inspection target while the movable unit is being moved in the predetermined direction along a predetermined direction by utilizing a time delay integration system at every timing at which a transfer clock is inputted and sequentially transfers the amounts of secondary charged particles or electromagnetic waves so integrated as an integrated detection amount at every timing at which a transfer clock is inputted, a position detection unit that detects a position of the movable unit which moves the inspection target, and a deflector which deflects, based on a difference between an actual position of the inspection target detected by the position detection unit and a target position of the inspection target, the secondary charged particles or electromagnetic waves directed towards the TDI sensor in a direction in which the difference is offset. When expressed by orthogonal coordinates in which the axis of abscissas represents time and the axis of ordinates represents target position, the target position is set into something like a step-and-riser shape in which the target position is kept in the same position by a predetermined period of time that is equal to or shorter than a transfer interval period which is a period from an input of a transfer clock to an input of the following transfer clock and thereafter rises by a predetermined distance.

According to another aspect of the invention, an inspection system is provided. This inspection system includes a primary optical system having an electron source from which charged particles are shed in the form of a beam, a current detection unit which detects an emission current value of the beam which is shed from the electron source, an imaging unit having an imaging device that detects an amount of secondary charged particles that are obtained by shedding the bean on to an inspection target, an image data generation unit that generates image data based on the results of imaging by the imaging unit, and a correction unit that corrects the results of imaging or image data based on the emission current value detected.

DESCRIPTION OF EMBODIMENTS

1. First Embodiment Group

Figure 1:
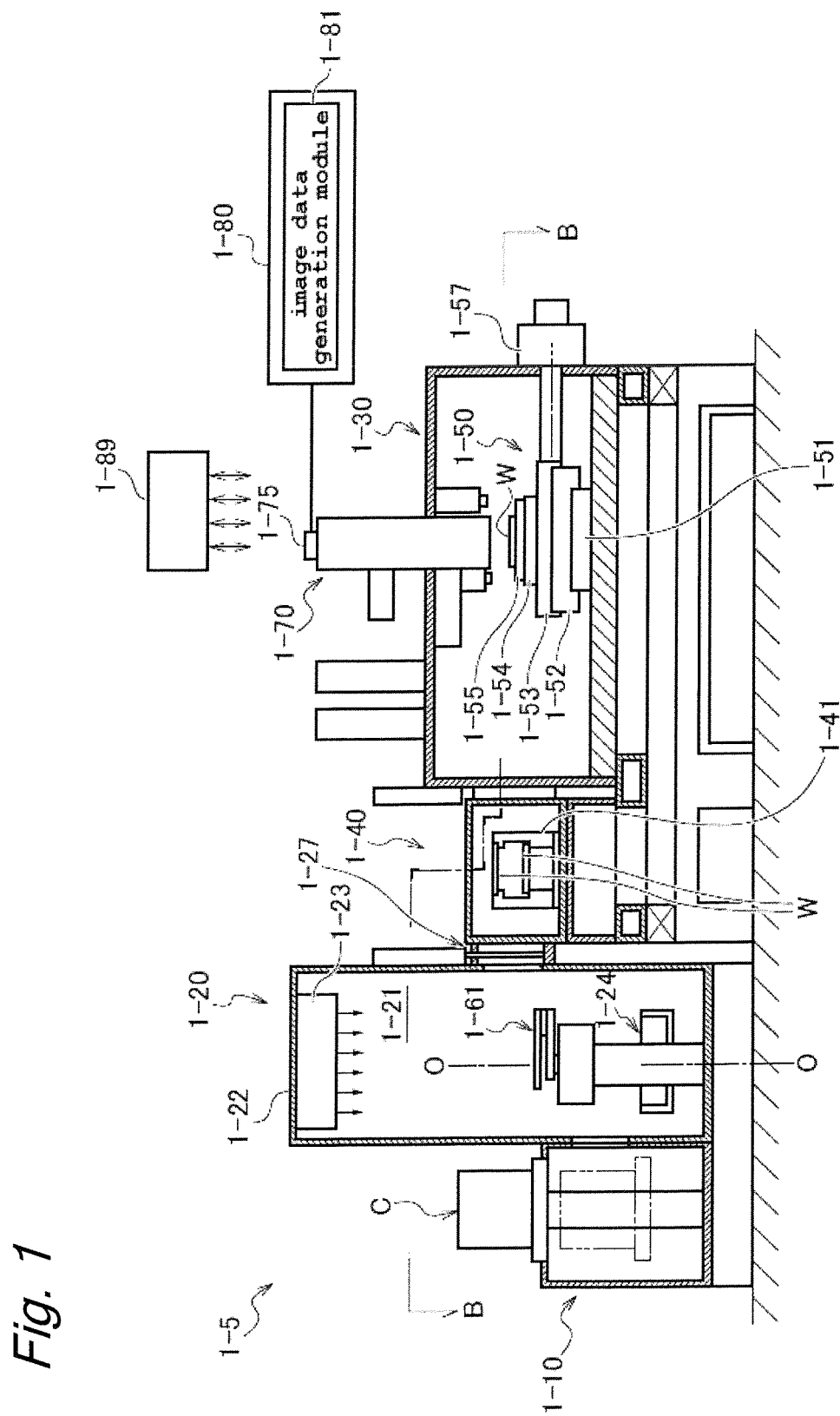
FIG. 1 is a schematic elevation of an inspection system according to a first embodiment group of the invention.

According to a first embodiment of a first embodiment group, an inspection system is provided. This inspection system includes a primary optical system that sheds either of charged particles and electromagnetic waves in the form of a beam, a movable unit that can hold an inspection target to move the inspection target through a position where the beam is shed by the primary optical system in a predetermined direction, a TDI sensor that integrates amounts of secondary charged particles or electromagnetic waves that are obtained by shedding the beam on to the inspection target while the movable unit is being moved in the predetermined direction along a predetermined direction by utilizing a time delay integration system at every timing at which a transfer clock is inputted and sequentially transfers the amounts of secondary charged particles or electromagnetic waves so integrated as an integrated detection amount at every timing at which a transfer clock is inputted, a position detection unit that detects a position of the movable unit which moves the inspection target, and a deflector which deflects, based on a difference between an actual position of the inspection target detected by the position detection unit and a target position of the inspection target, the secondary charged particles or electromagnetic waves directed towards the TDI sensor in a direction in which the difference is offset. When expressed by orthogonal coordinates in which the axis of abscissas represents time and the axis of ordinates represents target position, the target position is set into something like a step-and-riser shape in which the target position is kept in the same position by a predetermined period of time that is equal to or shorter than a transfer interval period which is a period from an input of the transfer clock to an input of the following transfer clock and thereafter rises by a predetermined distance.

According to the inspection system described above, when the EO correction is carried out, it is possible to restrain the projection image from moving away from the ideal position in association with the movement of the movable unit during the period of time when the target position is kept staying in the same position. Consequently, it is possible to reduce a risk of the actual position of the projection image deviating from the ideal position, as a result of which the inspection accuracy is improved.

According to a second embodiment of the first embodiment group, in the first embodiment, the target position is set into a step-and-rise shape in which the target position is kept staying in the same position by a period of time equal to the transfer interval period in synchronism with the input of the transfer clock and then rises by a distance corresponding to one pixel of the TDI sensor in parallel to the axis of ordinates. According to this embodiment, since the projection image is kept staying in the ideal position at all times, the inspection accuracy is improved further.

According to a third embodiment of the first embodiment group, in the first or second embodiment, the transfer clock is inputted at intervals of a constant period of time. According to this embodiment, the exposure time in each imaging device becomes constant. Consequently, the inspection accuracy can be improved by the simple configuration.

According to a fourth embodiment of the first embodiment group, in the first or second embodiment, the transfer clock is inputted every time it is detected based on the results of the detection by the position detection unit that the movable unit moves by the distance corresponding to one pixel of the TDI sensor. According to this embodiment, even though the moving speed of the movable unit varies, since the movement of the movable unit by the distance corresponding to one pixel is in complete synchronism with the transfer clock, and therefore, it is possible to position the projection image as close to the ideal position as possible with good accuracy. Consequently, the inspection accuracy can be improved.

According to a fifth embodiment of the first embodiment group, in the fourth embodiment, the inspection system includes an image generation module which generates image data based on the integrated detection amount, and a normalization module which normalizes the integrated detection amount or the image data based on a time required for the movable unit to move a predetermined distance during the integration. According to this embodiment, even though the moving speed of the movable unit varies, that is, even though the exposure time of the inspection target varies, it is possible to generate the image data in which the influence that is imposed by the variation in moving speed or exposure time is mitigated. As a result of this, the inspection accuracy can be improved further.

According to a sixth embodiment of the first embodiment group, in the fourth embodiment, the inspection system includes a prevention module which prevents the arrival of the beam at the inspection target or the arrival of the secondary charged particles or electromagnetic waves at the TDI sensor after a certain length of time elapses from the one transfer and until the following transfer is executed in the transfer interval period. According to this embodiment, in the period of time from one transfer to the following transfer in the TDI sensor, the time during which the inspection target is exposed or the time during which the TDI sensor receives the secondary charged particles becomes constant. Consequently, even though the moving speed of the movable unit varies, it is possible to suppress the generation of unevenness in luminance that would otherwise be caused by the variation in moving speed in the image data that is generated based on the integrated detection amount. As a result of this, the inspection accuracy can be improved further.

According to a seventh embodiment of the first embodiment group, in any one of the first to sixth embodiments, the primary optical system sheds the charged particles. The deflector includes an electron lens which deflects the secondary charged particles that are directed towards the TDI sensor. This embodiment can preferably be applied to an inspection system in which a primary optical system sheds charged particles or electromagnetic waves and secondary charged particles are detected by a TDI sensor.

According to an eighth embodiment of the first embodiment group, in any one of the first to sixth embodiments, the primary optical system sheds the electromagnetic waves. The deflector includes a movable lens, and a focal point of the secondary electromagnetic waves that are directed towards the TDI sensor is caused to deviate by moving the position of the movable lens. This embodiment can preferably be applied to an inspection system in which a primary optical system sheds electromagnetic waves, and an amount of secondary electromagnetic waves is detected by a TDI sensor.

According to a ninth embodiment of the first embodiment group, an inspection image data generation method is provided. This method includes a shedding step of shedding charged particles or electromagnetic waves in the form of a beam while moving an inspection target in a predetermined direction, a transfer step of integrating amounts of secondary charged particles or electromagnetic waves that are obtained by shedding the beam on to an inspection target along a predetermined direction through a time delay integration system by using a TDI sensor at every timing at which a transfer clock is inputted and sequentially transferring the amounts of secondary charged particles or electromagnetic waves so integrated as an integrated detection amount at every timing at which the transfer clock is inputted, a detecting step of detecting a position of the movable unit which moves the inspection target, a deflecting step of deflecting, based on a difference between an actual position of the inspection target detected by the position detection unit and a target position of the inspection target, the secondary charged particles or electromagnetic waves directed towards the TDI sensor in a direction in which the difference is offset, and a step of generating image data based on the integrated detection amount. When expressed by orthogonal coordinates in which the axis of abscissas represents time and the axis of ordinates represents target position, the target position is set into something like a step-and-riser shape in which the target position is kept in the same position by a predetermined period of time that is equal to or shorter than a transfer interval period which is a period from an input of a transfer clock to an input of the following transfer clock and thereafter rises by a predetermined distance.

In addition to the application to the first embodiment groups, the invention can be realized in various forms such as an inspection image data generating system, a program for generating an inspection image data, a storage medium that stores the program so as to be read by a computer, and the like. Hereinafter, the first embodiment group of the invention will be described by illustrating a more detailed embodiment.

1-A. Embodiment 1-A

Figure 2:
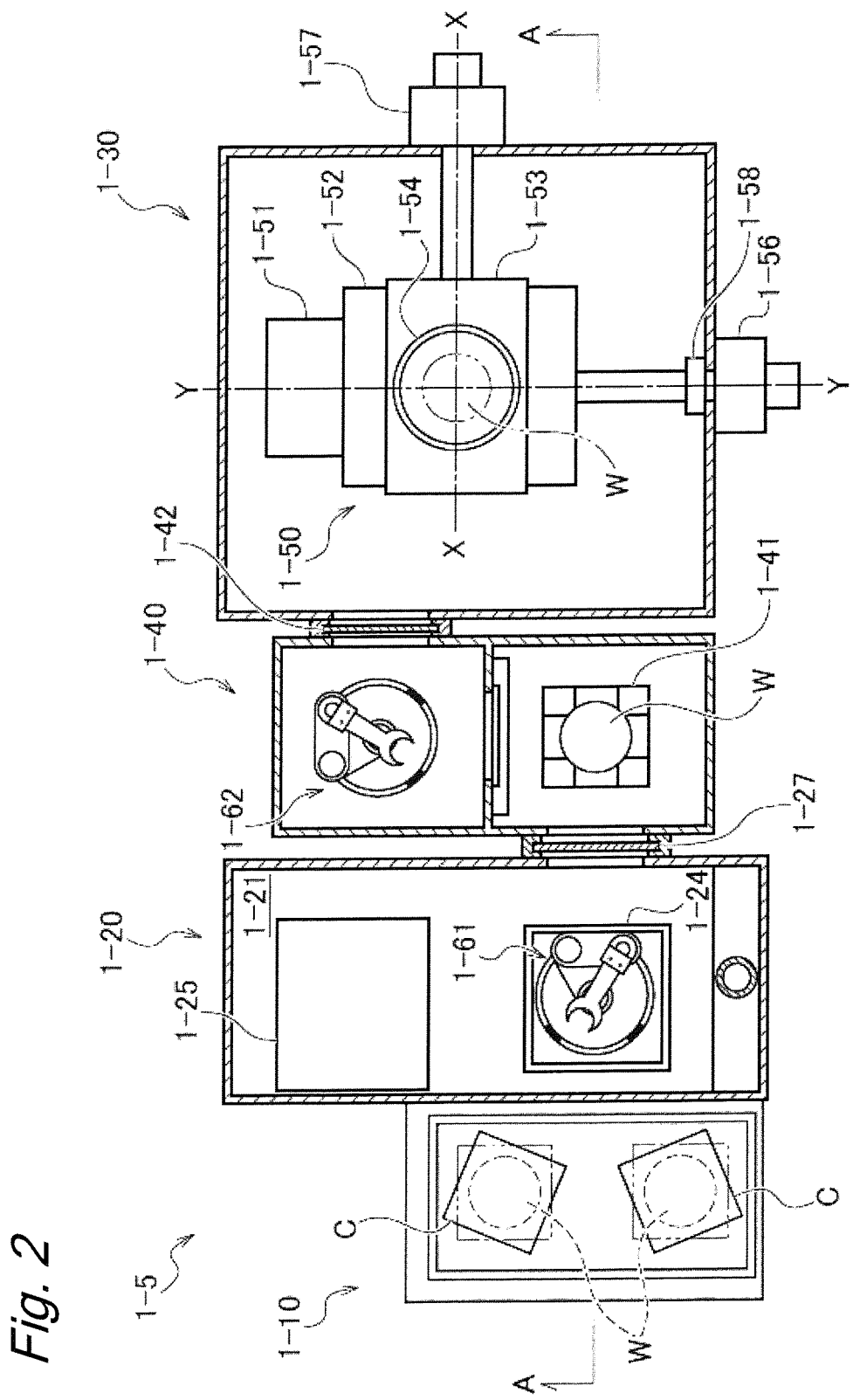
FIG. 2 is a schematic plan view of the inspection system shown in FIG. 1.

FIGS. 1 and 2 show a schematic configuration of a semiconductor inspection system (hereinafter, also referred to simply as an inspection system) 1-5 as an embodiment of an inspection system of the invention. FIG. 1 is a schematic elevation (as viewed in a direction indicated by arrows A-A in FIG. 2) of the inspection apparatus 1-5, and FIG. 2 is a schematic plan view (as viewed in a direction indicated by arrows B-B in FIG. 1) of the inspection system 1-5. The inspection system 1-5 is a system which inspects a pattern formed on a surface of an inspection target for a defect or inspects the surface of the inspection target for a foreign matter existing thereon. A semiconductor wafer, an exposure mask, an EUV mask, a nanoimprinting mask (and a template), an optic element substrate, an optical circuit substrate and the like can be raised as inspection targets. A particle, a cleaning residual (an organic matter), a reaction product on the surface and the like can be raised as foreign matters. The foreign matters include, for example, an insulating matter, a conductive matter, a semiconductor material or a composite thereof. In the following description, the inspection system 1-5 is described as inspecting a semiconductor wafer (hereinafter, also referred to simply as a waver W). An inspection of a wafer is carried out after the wafer has been treated or in the middle of the treatment of the wafer in a semiconductor fabrication process. The inspection is carried out on such inspection targets as a deposition step, a CMP treated or ion injected wafer, a wafer on a surface of which a wiring pattern is formed, a wafer on a surface of which no wiring pattern is formed yet and the like.

As shown in FIG. 1, the inspection system 1-5 includes a cassette holder 1-10, a mini-environment apparatus 1-20, a main housing 1-30, a loader housing 1-40, a stage unit 1-50, an electron optical unit 1-70, an image processing unit 1-80, and a control unit 1-89. As shown in FIGS. 1 and 2, the cassette holder 10 is configured to hold a plurality of (two in FIG. 2) cassettes C. The cassette C stores as inspection targets a plurality of wafers W in such a way as to be aligned parallel in a vertical direction. In this embodiment, the cassette holder 1-10 is configured to automatically set cassettes C in positions indicated by chain lines shown in FIG. 2 on an elevator table. Cassettes C which are set in the cassette holder 1-10 are automatically rotated to positions indicated by solid lines in FIG. 2, that is, positions where the cassettes C are oriented towards a rotating axis O-O (refer to FIG. 1) of a first conveyor unit 1-61 within the mini-environment apparatus 1-20, which will be described later.

As shown in FIGS. 1 and 2, the mini-environment apparatus 1-20 includes a housing 1-22, a gas circulation unit 1-23, a discharge unit 1-24, and a pre-aligner 1-25. A mini-environment space 1-21 is formed in an interior of the housing 1-22, and an atmosphere in the mini-environment space 1-21 is controlled. In addition, the first conveyor unit 1-61 is placed in the interior of the mini-environment space 1-21. The gas circulation unit 1-23 circulates a clean gas (here, air) within the mini-environment space 1-21 to control the atmosphere therein. The discharge unit 1-24 recovers part of air which is supplied into the mini-environment space 1-21 and discharges it to the outside of the mini-environment apparatus 1-20. By doing so, even though dust is produced by the first conveyor unit 1-61, the gas containing the dust is discharged out of the system. The pre-aligner 1-25 roughly positions wafers. The pre-aligner 1-25 is configured to detect an orientation flat formed on the wafer (a flat portion which is formed on an outer circumference of the circular wafer) or one or more V-shaped cutouts or notches which are formed in an outer circumferential edge of the wafer in an optical or mechanical fashion to determine in advance the position of the wafer in relation to a rotating direction about the axis O-O.

This first conveyor unit 1-61 has a multi-joint arm which can rotate about the axis O-O. This arm is configured to extend and contract in a radial direction. A gripping instrument is provided at a distal end of the arm to grip on a wafer W, and this gripping instrument is made up of, for example, a mechanical chuck, a vacuum chuck or an electrostatic clampless chuck. The arm can move vertically. The first conveyor unit 1-61 grips on a required wafer in the plurality of wafers held within the cassette holder 1-10 and transfers it to a wafer rack 1-41 within the loader housing 1-40, which will be described later.

As shown in FIGS. 1 and 2, the wafer rack 1-41 and a second conveyor unit 1-62 are placed in an interior of the loader housing 1-40. The housing 1-22 of the mini-environment apparatus 1-20 and the loader housing 1-40 are divided by a shutter unit 1-27, and the shutter unit 1-27 is opened only when a wafer W is transferred from the mini-environment apparatus 1-20 to the loader housing 1-40. The wafer rack 1-41 supports a plurality of (two in FIG. 1) wafers W horizontally in such a state that they are spaced apart from each other in a vertical direction. The second transfer unit 1-62 basically has the same configuration as that of the first transfer unit 1-61. The second conveyor unit 1-62 transfers a wafer W between the wafer rack 1-41 and a holder 1-55 of the stage unit 1-50, which will be described later. The atmosphere in the interior of the loader housing 1-40 is controlled so as to create a high vacuum state (at the degree of vacuum of $10^{-5}$ to $10^{-6}$ Pa), and an inactive gas (for example, a dried pure nitrogen gas) is injected thereinto.

As shown in FIGS. 1 and 2, the stage unit 1-50 is provided within the main housing 1-30 as an example of a movable unit which moves a wafer W. The stage unit 1-50 includes a fixed table 1-51 which is disposed on a bottom wall, a Y table 1-52 which moves in a Y direction on the fixed table, an X table 1-53 which moves in an X direction on the Y table, a turn table 1-54 which can turn on the X table, and a holder 1-55 which is disposed on the turn table 1-54. The Y table 1-52 is moved in the Y direction by a servo motor 1-56 which is an actuator which is provided outside the main housing 1-30. The X table 1-53 is moved in the X direction by a servo motor 1-57 which is an actuator which is provided outside the main housing 30. The holder 1-55 holds a wafer W in a releasable fashion on a resting surface thereof by means of a mechanical chuck or an electrostatic clampless chuck. The position of the wafer W held by the holder 1-55 in relation to the Y direction is detected by a position detection unit (a position sensor) 1-58. The position detection unit 1-58 is a laser interferometric distance measuring unit which makes use of the principle of an interferometer and detects a reference position on the resting surface of the holder 1-55 by means of a laser beam of a minute diameter. It is noted that the position of the position detection unit 1-58 is schematically shown in FIGS. 1 and 2. The position detection unit 1-58 sheds a laser beam towards a mirror plate which is fixed to the Y table 1-52 (or the holder 1-55), and a wafer W or, strictly speaking, coordinates on the Y table 1-52 (or the holder 1-55) are detected based on a difference in phase between an incident wave of the laser beam and a reflection wave from the mirror plate by a laser interferometer. The laser interferometer may be provided in the interior or exterior of the main housing 30. Additionally, the laser interferometer is connected to an optical pickup which is provided on an optical path of the laser beam by way of an optical fiber cable. Thus, the laser interferometer may be provided in a position which lies far away from the main housing 1-30.

The electron optical unit 1-70 sheds either charged particles or electromagnetic waves in the form of a beam on to a wafer W which is moving in the Y direction (refer to FIG. 2) and detects an amount of secondary charged particles which are obtained by the irradiation of the wafer W. The wafer W is moved by the stage unit 1-50. The electron optical unit 1-70 will be described in detail later.

Functioning as an image data generating module 1-81, the image processing unit 1-80 shown in FIG. 1 generates image data based on the amount of secondary charged particles detected by the electron optical unit 1-70. The image data generated has a luminance value as a gradation value. In this embodiment, the image processing unit 1-80 includes a memory and a CPU and realizes an image data generating function by executing a program which is stored in advance. It is noted that at least part of functional modules of the image processing unit 1-80 may be made of an exclusive hardware circuit.

The image data generated by the image processing unit 1-80 is used to inspect a pattern formed on a surface of the wafer W for a defect or inspect the surface of the wafer W for existence of a foreign matter thereon. This inspection may be carried out automatically by the use of an information processing unit. For example, the information processing unit may detect an area whose luminance value is equal to or higher than a threshold or may execute a pattern matching between the generated image data and a reference image data which is prepared in advance. Alternatively, the inspection may be executed by an inspector based on an image which is created by the image data or gradation values of individual pixels which make up the image data.

The control unit 1-89 shown in FIG. 1 controls the operation of the inspection system 1-5 as a whole. For example, the control unit 1-89 issues a command to move to the stage unit 1-50 so that the holder 1-55 which holds a wafer W moves in the Y direction at a predetermined moving speed. The control unit 1-89 may include a memory and a CPU to realize required functions by executing a program which is stored therein in advance. Alternatively, in addition to or in place of realizing the required functions through the software, the control unit 1-89 may realize at least part of the required functions by an exclusive hardware circuit.

Figure 3:
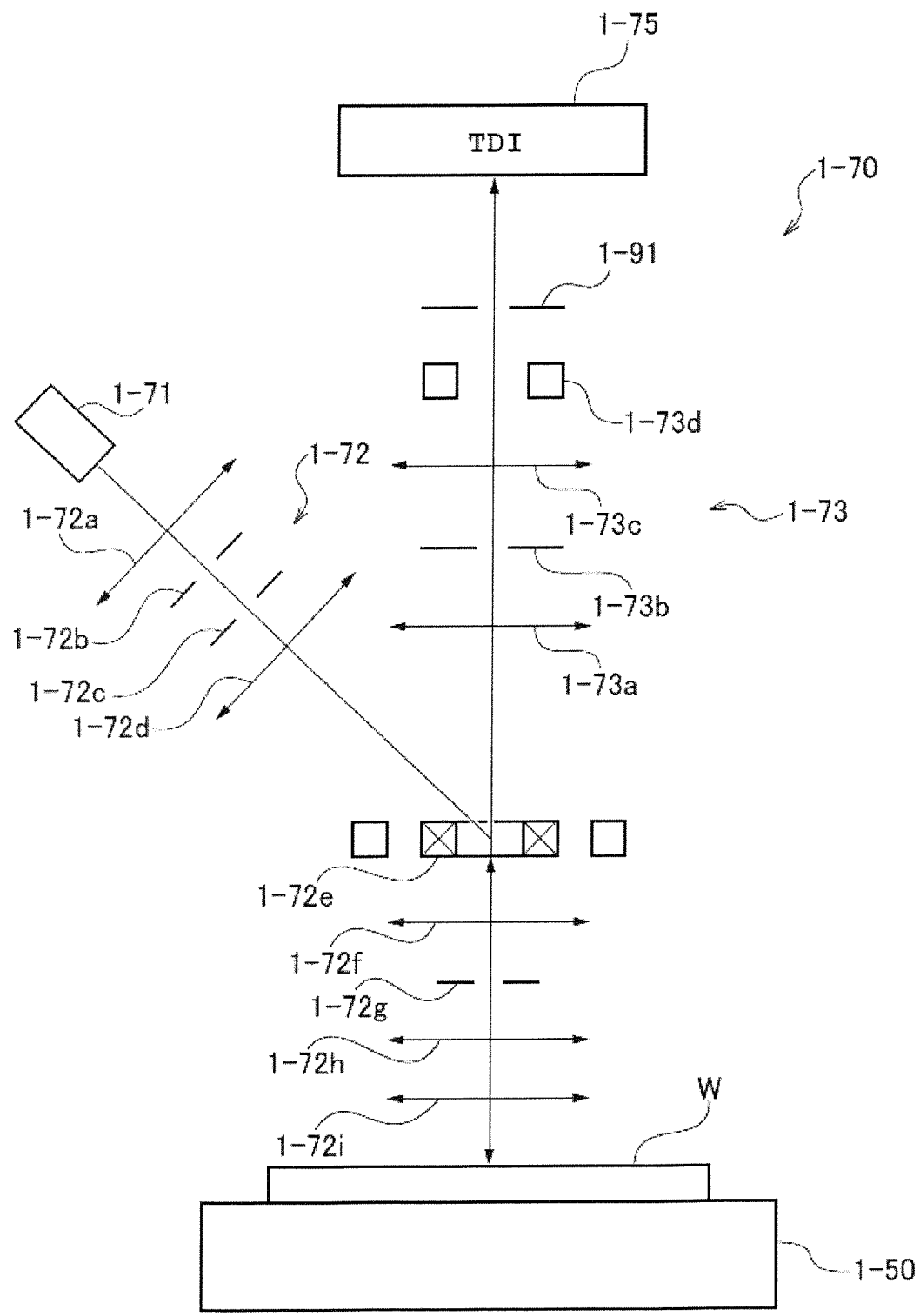
FIG. 3 is an explanatory drawing showing a schematic configuration of an electron optical unit.

FIG. 3 shows a schematic configuration of the electron optical unit 1-70. As shown in FIG. 3, the electron optical unit 1-70 includes a primary optical system 1-72, a secondary optical system 1-73, a TDI sensor 1-75, and a deflection electrode 1-91. The primary optical system 1-72 generates charged particles in the form of a beam and sheds the beam on to the wafer W which is held by the holder 55. This primary optical system 1-72 includes a light source 1-71, lenses 1-72*a*, 1-72*d*, apertures 1-72*b*, 1-72*c*, an ExB filter 1-72*e*, lenses 1-72*f*, 1-72*h*, 1-72*i*, and an aperture 1-72*g*. In this embodiment, the light source 1-71 is an electron gun which generates an electron beam. However, the light source 1-71 can be made up of an arbitrary device which generates either charged particles or electromagnetic waves such as, for example, an UV (Ultraviolet) laser, a DUV (Deep Ultraviolet) laser, an EUV (Extreme Ultraviolet) laser, an X-ray laser and the like. It is noted that the configuration of the primary optical system 1-72 and the configuration of the secondary optical system 1-73, which will be described later, are modified as required according to the type of the light source 1-71.

Secondary charged particles are obtained by shedding charged particles or electromagnetic waves on to the wafer W, and the obtained secondary charged particles reflect a state of the wafer W (a condition of a pattern formed thereon, whether or not a foreign matter adheres thereto, or the like). In this specification, the secondary charged particle is any one of a secondary emission electron, a mirror electron and an optoelectron, or a mixing of at least two of these electrons. The secondary emission electron is any one of a secondary electron, a reflection electron and a back-scattering electron, or a mixing of at least two of these electrons. The secondary emission electron is generated as a result of collision of a charged particle against a surface of a wafer W when the charged particle, that is, an electron beam or the like is shed on to the surface of the wafer W. The mirror electron is generated as a result of a charged particle not colliding with a surface of a wafer W but being reflected near the surface when the charged particle, that is, an electron beam or the like is shed on to the surface of the wafer W. The optoelectron is generated from a surface of a wafer W when an electromagnetic wave is shed on to the surface of the wafer W.

The lenses 1-72*a*, 1-72*d* and the apertures 1-72*b*, 172*c* shape an electron beam generated by the light source 1-71 and guides the electron beam to the ExB filter 1-72*e* by controlling the direction of the electron beam so that the electron beam is incident on the ExB filter 1-72*e* obliquely. The electron beam which has entered the ExB filter 1-72*e* is subjected to the influence of a Lorentz force generated by magnetic field and electric field to thereby be deflected vertically downwards and is then guided towards the wafer W through the lenses 1-72*f*, 1-72*h*, 1-72*i* and the aperture 1-72*g*. The lenses 1-72*f*, 1-72*h*, 1-72*i* control the direction of the electron beam and reduces the speed of the electron beam appropriately to regulate the landing energy.

A foreign matter on the wafer W is charged up by the electron beam shed on to the wafer W, whereby part of the incident electrons is forced backwards without being brought into contact with the wafer W. This guides the mirror electron to the TDI sensor 1-75 through the secondary optical system 1-73. In addition, a secondary emission electron is emitted as a result of part of the incident electrons being brought into contact with an upper surface of the wafer W.

The secondary charged particle (here, the mirror electron and the secondary emission electron) which is obtained by shedding the electron beam on to the wafer W passes again through the objective lens 1-72*i*, the lens 1-72*h*, the aperture 1-72*g*, the lens 1-72*f* and the ExB filter 1-72*e* and is thereafter guided to the secondary optical system 1-73. The secondary optical system 1-73 guides the secondary charged particle obtained by shedding the electron beam on to the wafer W to the TDI sensor 1-75. The secondary optical system 1-73 includes lenses 1-73*a*, 1-73*c*, an NA aperture 1-73*b* and an aligner 1-73*d*. In the secondary optical system 1-73, secondary charged particles are collected as a result of passing through the lens 1-73a, the NA aperture 1-73b and the lens 1-73c and are shaped by the aligner 1-73d. The NA aperture 1-73b has a role of regulating a transmissivity and aberration of the secondary system.

The TDI sensor has a plurality of imaging devices which are arranged in a stack in a predetermined number (a plurality) of stages in the Y direction and detects an amount of secondary charged particles which are guided by the secondary optical system 1-73. In this embodiment, the TDI sensor 1-75 also includes imaging devices which are arranged in the X direction. The detection at the TDI sensor 1-75 is carried out in such a way that the electron beam is shed on to the wafer W while moving the wafer W along the Y direction by the stage unit 1-50 and amounts (electric charges) of secondary charged particles that are obtained by shedding the electron beam on to the wafer W are integrated along the Y direction by the number of stages stacked in the Y direction through the time delay integration system. The moving direction of the wafer W and the integrating direction by the TDI sensor 1-75 are the same. The amount of secondary charged particles is integrated stage by stage every time a transfer clock is inputted into the TDI sensor. In other words, electric charges accumulated in one pixel of the TDI sensor 1-75 are transferred to an adjacent pixel every time a transfer clock is inputted into the TDI sensor 1-75. Then, the detection amounts of secondary charged particles which are integrated by the number of stages stacked in the Y direction, that is, the detection amounts which are integrated to a final stage (also, referred to as an integrated detection amount) are transferred to the image processing unit 1-80 every time a transfer clock is inputted into the TDI sensor 1-75. The integrating direction by the TDI sensor 1-75 is not limited to the Y direction, and hence, the detection amounts may be integrated in the X direction. As this occurs, the wafer W is moved in the X direction.

The integrated detection amount (the luminance data) that is obtained in this way reflects preferably the existence or non-existence of a foreign matter on the wafer W. This is because since the mirror electrons do not scatter, whereas the secondary emission electrons scatter, the amount of secondary charged particles obtained from an area on the wafer W where a foreign matter exists becomes much larger than the amount of secondary charged particles obtained from other areas. Namely, compared with the area where no foreign matter exists, the area where a foreign matter exists is imaged as an area having a high luminance.

In this embodiment, a transfer clock is inputted into the TDI sensor 1-75 at intervals of a constant period of time. This constant period of time is set to a time required for the wafer W (the holder 1-55) to move by a distance corresponding to one pixel in an ideal state, that is, in a state in which the moving speed of the holder 1-55 is completely constant. However, in reality, it is difficult to keep the wafer W moving strictly at a constant speed while amounts of secondary charged particles are being integrated in the TDI sensor 75. This means that an actual projecting position of a projection image that is formed by secondary charged particles on the TDI sensor 1-75 deviates from the ideal position. The deflection electrode (electrostatic lens) 1-91 is provided to suppress the influence imposed on image data by the deviation of the projection image from the ideal position by executing an EO correction. Specifically, a voltage according to a difference between coordinates of a target position of the holder 1-55 (the wafer W) that is determined in advance and coordinates of an actual position of the holder 1-55 (the wafer W) that is detected by the position detection unit 1-58 is applied to the deflection electrode 1-91. When the voltage is applied to the deflection electrode 1-91, the deflection electrode 1-91 deflects secondary charged particles in a direction in which the difference is offset through electrostatic deflection. Various types of electron lenses can be used to deflect secondary charged particles, and an electromagnetic lens can also be adopted in place of the electrostatic lens. Hereinafter, an EO correction carried out in this embodiment will be described.

Figure 4A:
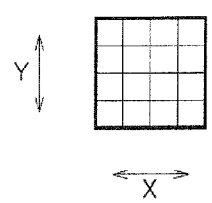
FIGS. 4A to 4C are explanatory drawings which show schematically ideal positions and real positions of a projection image projected on to a TDI sensor.
Figure 4B:
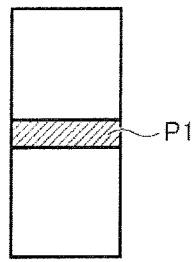
Figure 4C:
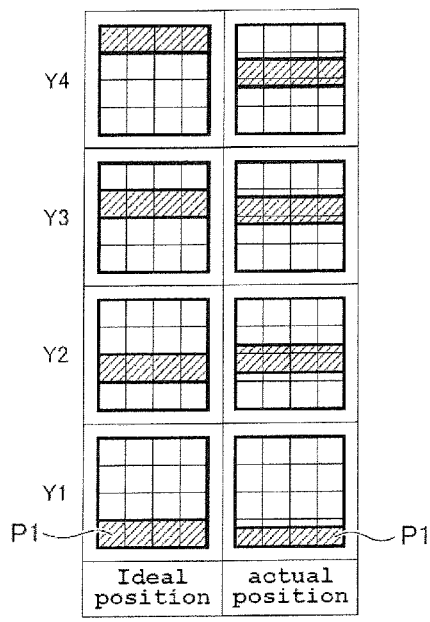

FIGS. 4A to 4C show schematically ideal positions and real positions of a projection image projected on to the TDI sensor 1-75. FIG. 4A shows a pixel array that the TDI sensor 1-75 includes. FIG. 4B shows a pattern P1 that is formed on the waver W which constitutes an inspection target. In this example, a width of the pattern P1 in the Y direction corresponds to one pixel. FIG. 4C shows ideal positions and actual positions of the pattern P1 that result at timings when a transfer clock is inputted with the pattern P1 moving along the Y direction. As shown in the figure, the ideal positions of the pattern P1 are positions Y1 to Y4 that lie apart by one pixel along the direction Y. Namely, the pattern P1 moves accurately by one pixel every time a transfer clock is inputted (every time a constant period of time elapses). On the other hand, the actual positions of the pattern P1 deviate forwards or backwards from the corresponding ideal positions in the direction Y due to the variation in the moving speed of the holder 1-55. The EO correction is called for to correct the deviation of the actual positions from the ideal positions of the wafer W.

Figure 5:
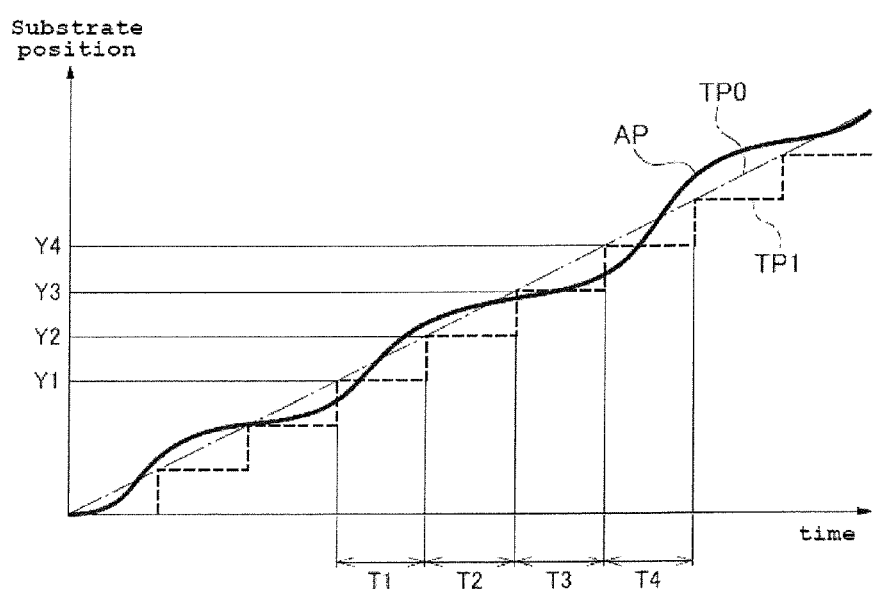
FIG. 5 is an explanatory drawing which shows an actual position of a substrate and target positions of the substrate which result from an EO correction in a conventional system and an embodiment 1-A.

FIG. 5 shows an actual position of the wafer W and target positions of the wafer W according to the conventional EO correction and the EO correction of this embodiment, which are expressed by orthogonal coordinates. The axis of abscissas represents time, and the axis of ordinates represents the position of the wafer W in the direction Y. Periods of time T1 to T4 each denote a time taken from an input of a transfer clock until an input of the following transfer clock. In this embodiment, since a transfer clock is inputted every time a constant period of time elapses as described above, the periods of time T1 to T4 are equal to each other in length. The positions Y2 to Y4 of the wafer W in the direction Y are positions where the waver W arrives after it advances by one pixel from the position Y1. The actual position AP of the wafer W is shown as a complex curve which results from the variation in the moving speed of the wafer W in the direction Y, as shown in the figure. In the target position TP0 according to the conventional EO correction, as shown in the figure, the wafer W advances by one pixel rectilinearly every time a transfer clock is inputted. Namely, the conventional target position TP0 corresponds to a case where the moving speed of the wafer W in the direction Y is constant.

On the other hand, the target position TP1 according to the EO correction of this embodiment is set into a step-like fashion as a whole, as shown in the figure. Specifically, when looking at one period of time (for example, the period of time T1), the target position TP1 is set into a step-and-riser shape in which the target position is kept staying in the same position by a predetermined period of time which is equal to or shorter than a period of time (for example, the period of time T1) from an input of one transfer clock until an input of the following transfer clock and thereafter rises by a predetermined distance. In this embodiment, the target position TP1 is kept staying in the same position by the same period of time as the period of time from an input of a transfer clock until an input of the following transfer clock and thereafter rises by a distance corresponding to one pixel of the TDI sensor 1-75 in parallel to the axis of ordinates in synchronism with the transfer clock.

Figure 6:
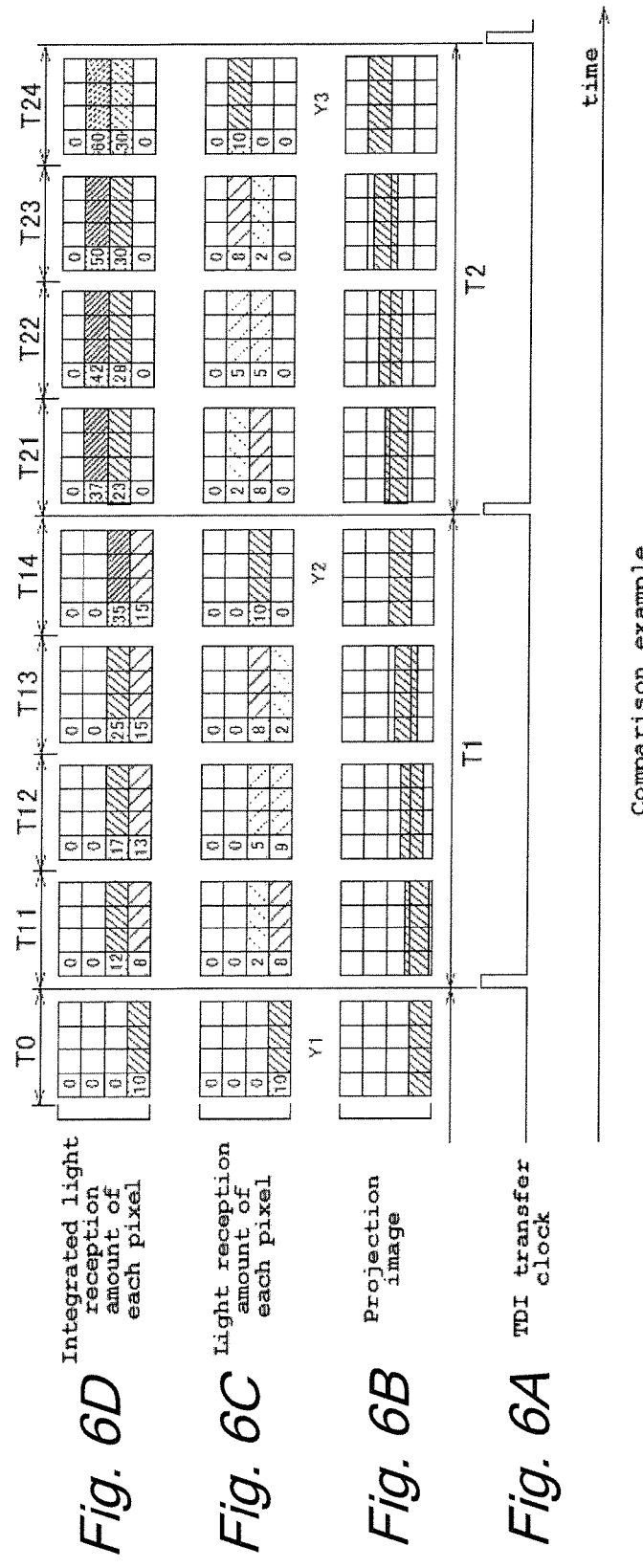
FIGS. 6A to 6D are explanatory drawings which show schematically respective light reception amounts of pixels in a TDI sensor in a comparison example (the conventional system).
Figure 7:
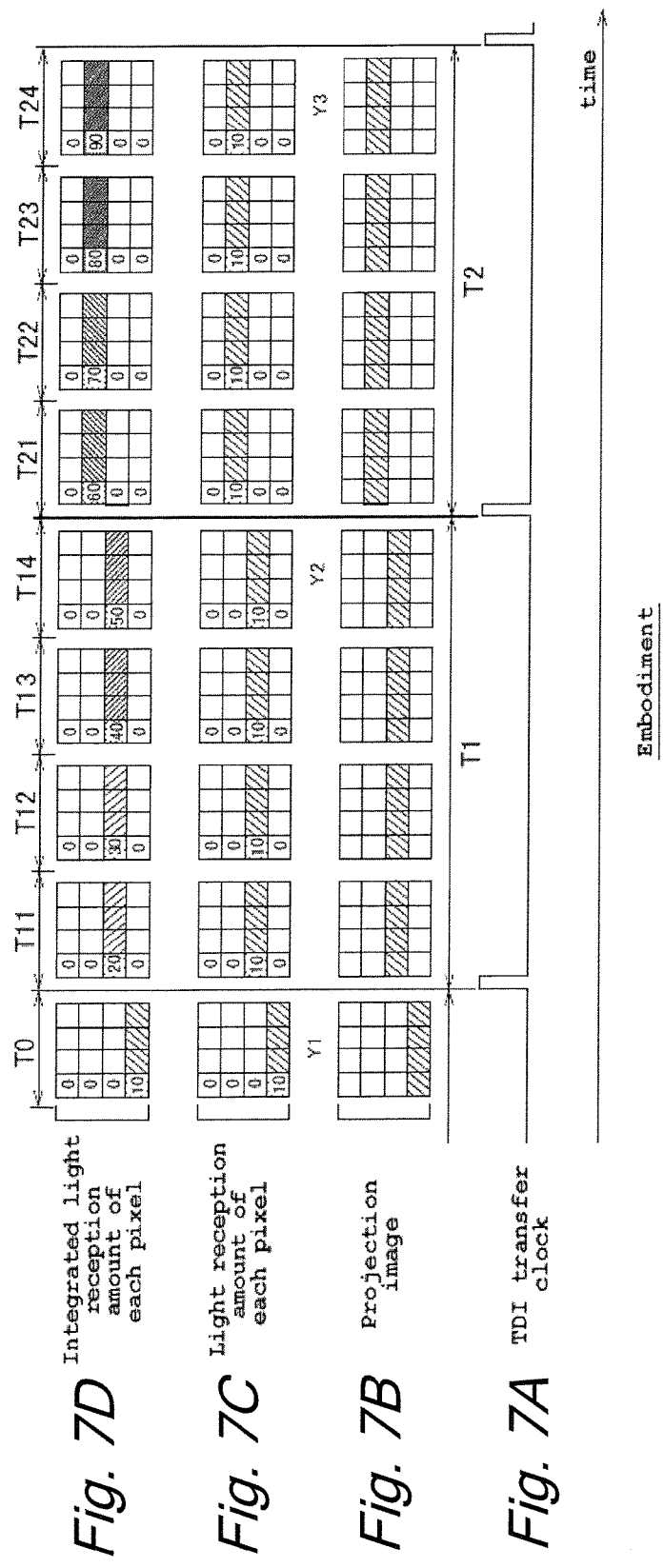
FIGS. 7A to 7D are explanatory drawings which show schematically respective light reception amounts of pixels in a TDI sensor in the embodiment 1-A.

FIGS. 6A to 6D and FIGS. 7A to 7D show schematically respective light reception amounts of pixels of the TDI sensor 1-75 according to a comparison example and this embodiment, respectively. FIGS. 6A to 6D show the respective light reception amounts of the pixels based on the target position TP0 according to the conventional EO correction shown in FIG. 5. FIGS. 7A to 7D show the respective light reception amounts of the pixels based on the target position TP1 according to the EO correction of this embodiment shown in FIG. 5. FIG. 6A shows transfer clocks that are inputted into the TDI sensor 1-75. The transfer clocks are inputted at intervals of a constant period of time. As shown in FIG. 6B, in the conventional EO correction, the projection image moves continuously from the position Y1 to the position Y2 based on the target position TP0 that is preset in the period of time T1 that corresponds to one cycle of a transfer clock inputted into the TDI sensor 1-75. Similarly, in the period of time T2, the projection image moves from the position Y2 to the position Y3. It is noted that since the control of the position of the projection image by the EO correction is a feedback control based on a difference between the actual position and the target position, a slight time delay results in reality. However, in FIGS. 6A to 6D, the target position is shown on the assumption that there exists no time delay.

When the projection image moves in the way described above, the projection image is projected so as to extend over any two pixels that lie adjacent to each other in the direction Y. For example, as shown in FIG. 6c, light reception amounts of two pixels of the TDI sensor 1-75 which lie adjacent to each other in the direction Y in periods of time T11 to T14 which result from diving the period of time T1 into four sub-periods of time are expressed by (L1, L2). Here, L1 represents a light reception amount L1 of a pixel in a bottom line, and L2 represents a light reception amount of a pixel in a line directly above the bottom line. Additionally, assuming that a total light reception amount of each of the periods of time T11 to T14 is "10," the light reception amounts of the two adjacent pixels in the position Y1 are expressed by (10, 0), and as time goes by, the reception amounts change sequentially from (8, 2), (5, 5) and to (2, 8). Finally, the light reception amounts of the two pixels become (0, 10) in the position Y2. FIG. 6D shows integrated light reception amounts of the pixels when the light reception amounts are transferred in response to an input of a transfer clock. For example, in the period of time T11, the light reception amount (10, 0) received in the period of time T0 that occurred before the period of time T1 is transferred (after the transfer, the light reception amount becomes (0, 10)). Then, the light reception amounts (2, 8) of the two pixels received in the period of time T11 are added, and the light reception amounts at the end of the period of time T11 become (8, 12). Then, the light reception amounts (L2, L3) of the pixels in the second line and the third line from the bottom become (30, 60) at the end of the period of time T2. This means that the pattern P1 whose width corresponds to the width of one pixel is imaged as a pattern whose width corresponds to a total of widths of two pixels, resulting in an image that blurs in the direction Y.

On the other hand, as shown in FIG. 7B, in the EO correction according to this embodiment, the projection image is kept staying in the position Y2 during the period of time T1 that corresponds to one cycle of a transfer clock that is inputted into the TDI sensor 1-75 based on the target position TP1 that is preset. Similarly, in the period of time T2, the projection image is kept staying in the position Y3. As this occurs, as respective light reception amounts of the pixels in the periods of time T1, T2, light is received by only one of the pixels that are aligned in the direction Y, as shown in FIG. 7C. Because of this, at the end of the period of time T2, the light reception amounts (L2, L3) of the pixels in the second line and the third line from the bottom become (0, 90). This means that the pattern P1 whose width corresponds to the width of one pixel is imaged as a pattern P1 whose width corresponds to the width of one pixel with good accuracy.

Figure 8:
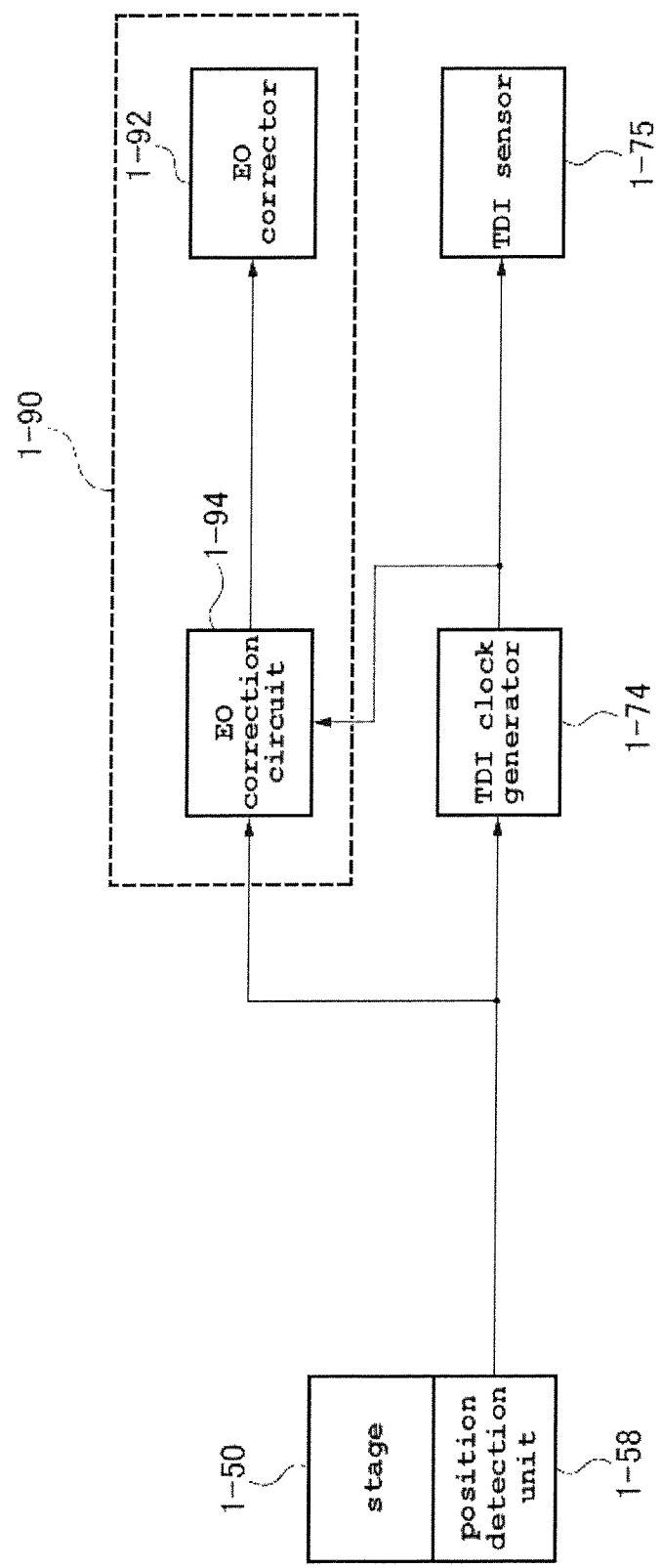
FIG. 8 is a schematic drawing which shows a configuration for an EO correction.

FIG. 8 shows an example of a configuration for realizing the EO correction of this embodiment that has been described above. A deflector 1-90 of the inspection system 1-5 includes an EO corrector 1-92 and an EO correction circuit 1-94. The EO corrector 1-92 includes the deflection electrode 1-91 described above and an amplifier (not shown). The EO correction circuit 1-94 controls a voltage applied to the deflection electrode 1-91, that is, a deflection gain.

When a command to move is imparted to the stage unit 1-50 (the servo motor 1-56) from the control unit 1-89, the Y table 1-52 is moved in the direction Y. A moving amount of this Y table 1-52 is detected by the position detection unit 1-58. Then, the positional information detected by the position detection unit 1-58 is inputted into a TDI clock generator 1-74 and the a) correction circuit 1-94. The TDI clock generator 1-74 starts the generation of a clock at intervals of the constant period of time (corresponding to the period of time T1 shown in FIG. 5) at a timing at which the Y table 1-52 is set in a predetermined initial position thereof. The clock so generated is inputted into the TDI sensor 1-75 as a transfer clock. Additionally, this clock is also inputted into the EO correction circuit 1-94. The EO control circuit 1-94 controls the EO corrector 1-92 based on the clock so inputted in such a way that the projection image on to the TDI sensor 1-75 is corrected from the actual position AP to the target position TP1.

Figure 9:
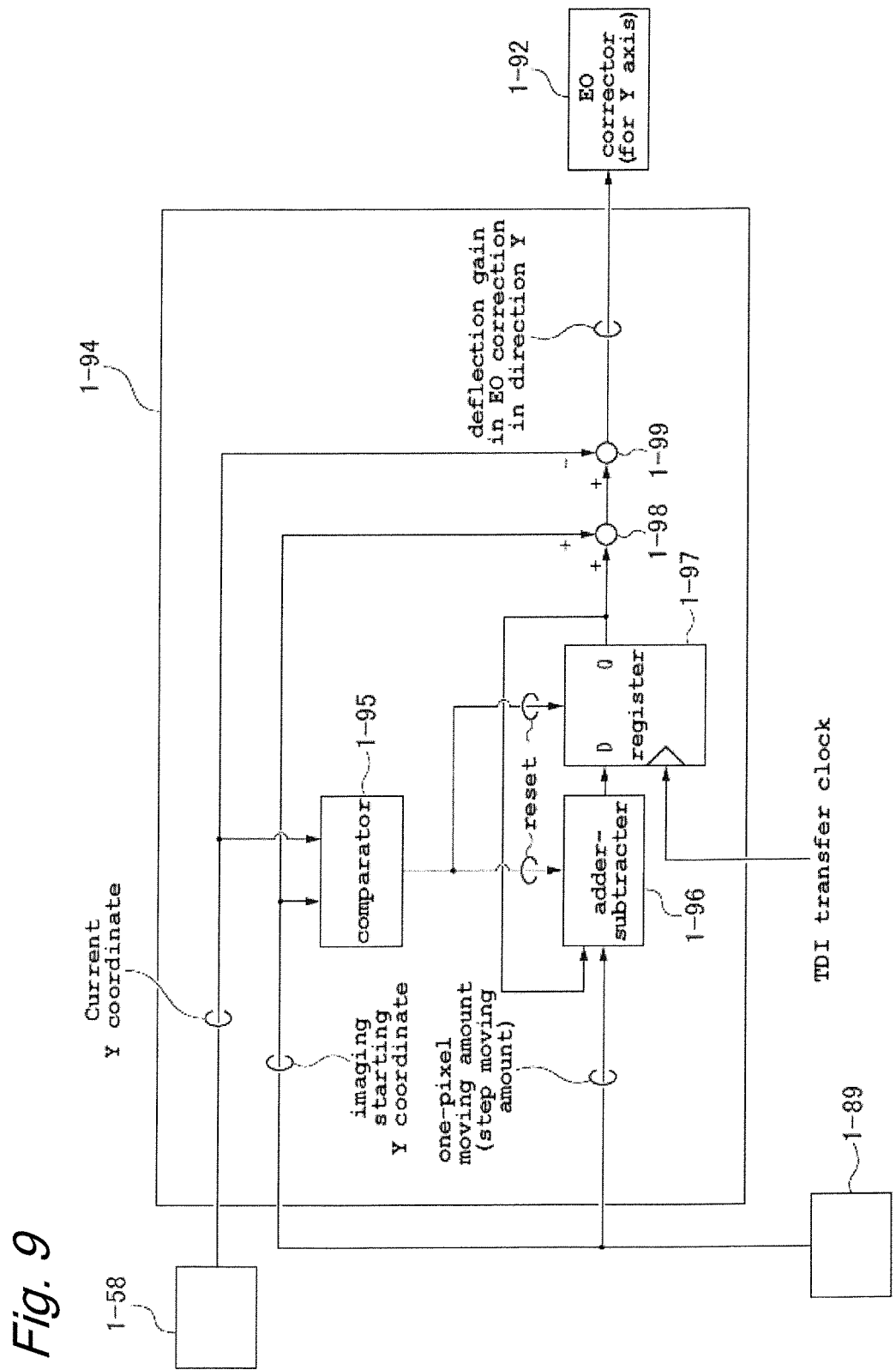
FIG. 9 is a schematic drawing which shows the configuration of an EO correction circuit.

FIG. 9 shows an example of the EO correction circuit 1-94. The EO correction circuit 1-94 includes a comparator 1-95, an adder-subtracter 1-96, a register 1-97, an adder 1-98, and a subtracter 1-99. The EO correction circuit 1-94 executes an EO correction process as below. Firstly, the user inputting a command to image the wafer W into the control unit 1-89, the control unit 1-89 inputs an imaging starting Y coordinate, that is, an initial position of imaging into the comparator 1-95 and the adder 1-98 and inputs a one-pixel moving amount, that is, a distance corresponding to one pixel into the adder-subtracter 1-96.

The position detection unit 1-58 inputs the detected current Y coordinate, that is, the actual position of the wafer W into the comparator 1-95 and the subtracter 1-99 at all times. The comparator 1-95 sends out a reset signal to the adder-subtracter 1-96 and the register 1-97 when the imaging starting Y coordinate inputted coincides with the current Y coordinate. These steps are carried out to execute a zero correction on the wafer W.

The adder-subtracter 1-96 inputs the inputted one-pixel moving amount into the register 1-97 after the reset signal is inputted thereinto. A transfer clock is inputted into the register 1-97 from the TDI clock generator 1-74. The register 1-97 outputs the value inputted from the adder-subtracter 1-96 to the adder 1-98 every time the transfer clock is inputted. The output of the register 1-97 is inputted into the adder 1-98, and at the same time, the output is fed back to the adder-subtracter 1-96. Thereafter, the adder-subtracter 1-96 adds the one-pixel moving amount to the value fed back thereto and outputs the resulting value to the register 1-97. Thus, assuming that the one-pixel moving amount is referred to as N, the register 1-97 outputs sequentially values which increases by an increment of N like N, 2N, 3N, 4N in synchronism with the input of the TDI transfer clock thereinto. The adder 1-98 adds the value inputted from the register 1-97 and the imaging starting Y coordinate value inputted from the control unit 1-89 together and outputs the resulting value to the subtracter 1-99.

The subtracter 1-99 calculates a difference between the value inputted from the adder 1-98 and the current Y coordinate value inputted from the position detection unit 1-58 and outputs the difference so calculated to the EO corrector 1-92 as a deflection gain in the direction Y in the EO correction. As is obvious from what has been described heretofore, the EO correction circuit 1-94 generates the target position TP1 and outputs the difference between the target position TP1 and the actual position AP to the EO collector 1-92. The EO corrector 1-92 deflects secondary charged particles that are directed towards the TDI sensor 1-75 based on the deflection gain inputted from the EO correction circuit 1-94 in a direction in which the difference between the target position TP1 and the actual position AP is offset. In other words, the EO corrector 1-92 deflects the secondary charged particles directed towards the TDI sensor 1-75 so that the projection image of the wafer W in the actual position AP coincides with the projection image of the wafer W in the target position TP1. This control enables the accurate imaging shown in FIG. 7.

According to the inspection system 1-5 according to this embodiment, in executing the EO correction, the projection image does not move during the period of time while the target position TP1 of the wafer W is kept staying in the same position, and therefore, the projection image can be restrained from moving away from the ideal position. Specifically speaking, the projection image on the area corresponding to one pixel of the imaging target can be restrained from moving away from the position where the projection image is projected on only to one pixel of the TDI sensor 1-75 where the projection image should be projected. Consequently, it is possible to reduce the risk of the ideal position deviating from the actual position AP of the projection image, as a result of which the inspection accuracy is improved. In particular, in this embodiment, the projection image of the wafer W in the actual position AP coincides completely with the projection image of the wafer W in the target position TP1, and therefore, the projection image is kept staying in the ideal position at all times, which improves further the inspection accuracy.

In addition, according to the inspection system 1-5, the transfer clock is inputted into the TDI sensor 1-75 at intervals of the constant period of time, and therefore, the exposure time at each imaging device of the TDI sensor 1-75 becomes constant. Consequently, even though the moving speed of the wafer W varies, there is no such situation in which the exposure time at each imaging device varies, whereby the unevenness in luminance attributed to the variation in exposure time is not generated in image data that is generated by the image processing unit 1-80. As a result of this, the inspection target can be inspected with good accuracy with the simple configuration.

1-B. Embodiment 1-B

Figure 10:
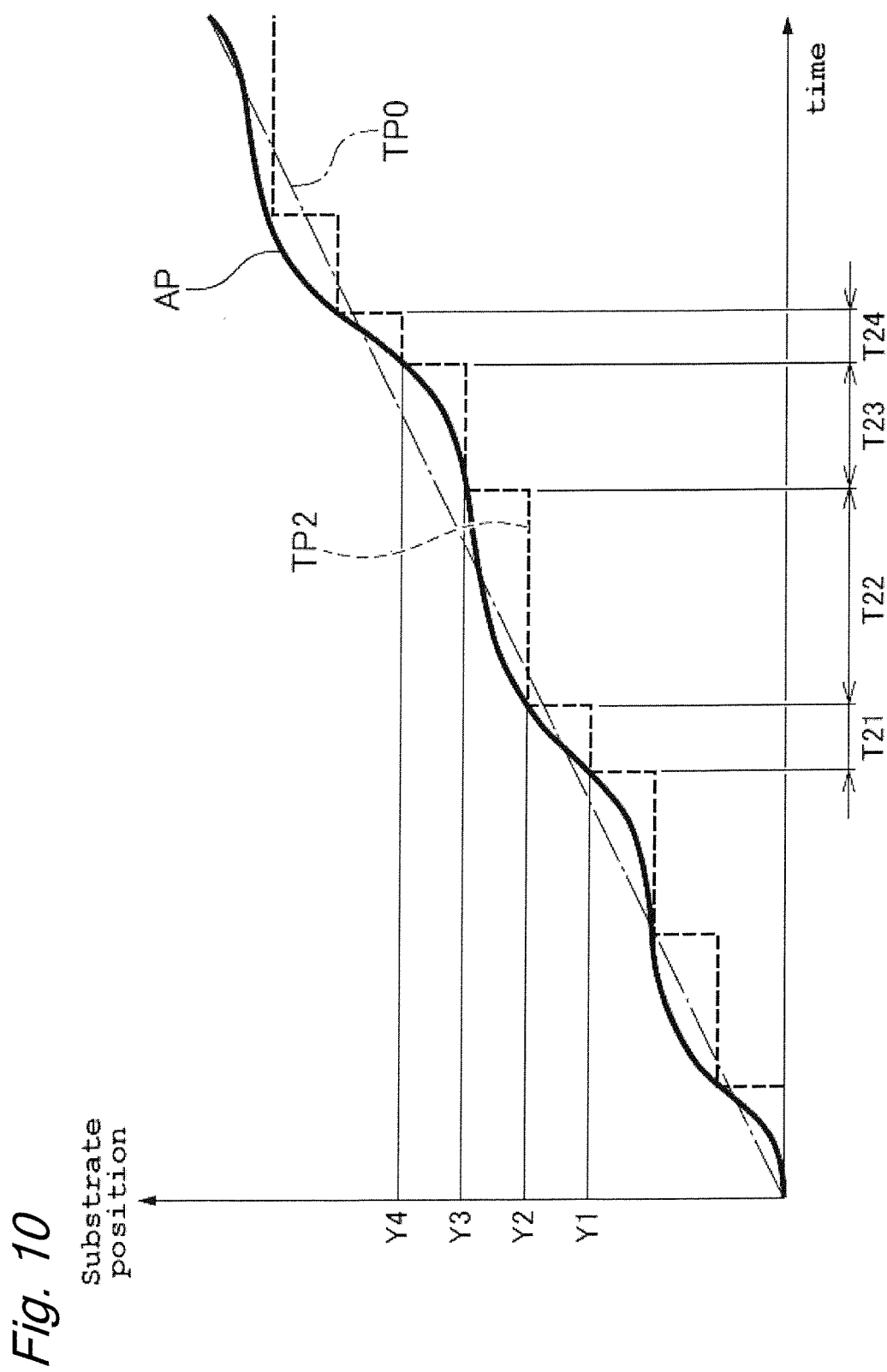
FIG. 10 is an explanatory drawing which shows an actual position of a substrate and target positions of the substrate which result from an EO correction in the conventional system and an embodiment 1-B.

FIG. 10 is an explanatory drawing which shows an actual position of a wafer W and a target position of the wafer W when an EO correction is executed in an embodiment 1-B. FIG. 10 corresponds to FIG. 5. In the embodiment 1-B, a transfer clock is inputted into a TDI sensor 1-75 every time the wafer W moves by a distance corresponding to one pixel in a direction Y. In this embodiment 1-B, too, a target position TP2 according to the EO correction of this embodiment is set into a step-like fashion as a whole, as shown in FIG. 10. Specifically, when looking at a specific period of time, the target position TP2 is set into a step-and-riser shape in which the target position is kept staying in the same position by a period of time which is equal to a period of time from an input of one transfer clock until an input of the following transfer clock and thereafter rises by a distance equal to one pixel of the TDI sensor 1-75 in parallel to the axis of ordinates in synchronism with the transfer clock. As is obvious from FIG. 10, when the conveying speed of the wafer W varies, that is, when the actual position AP curves, times (periods of time T21 to T24 in the figure) taken for the wafer W to move one pixel differ. It is noted that in FIG. 10, the difference between the periods of time T21 to T24 is shown as being exaggerated.

Figure 11:
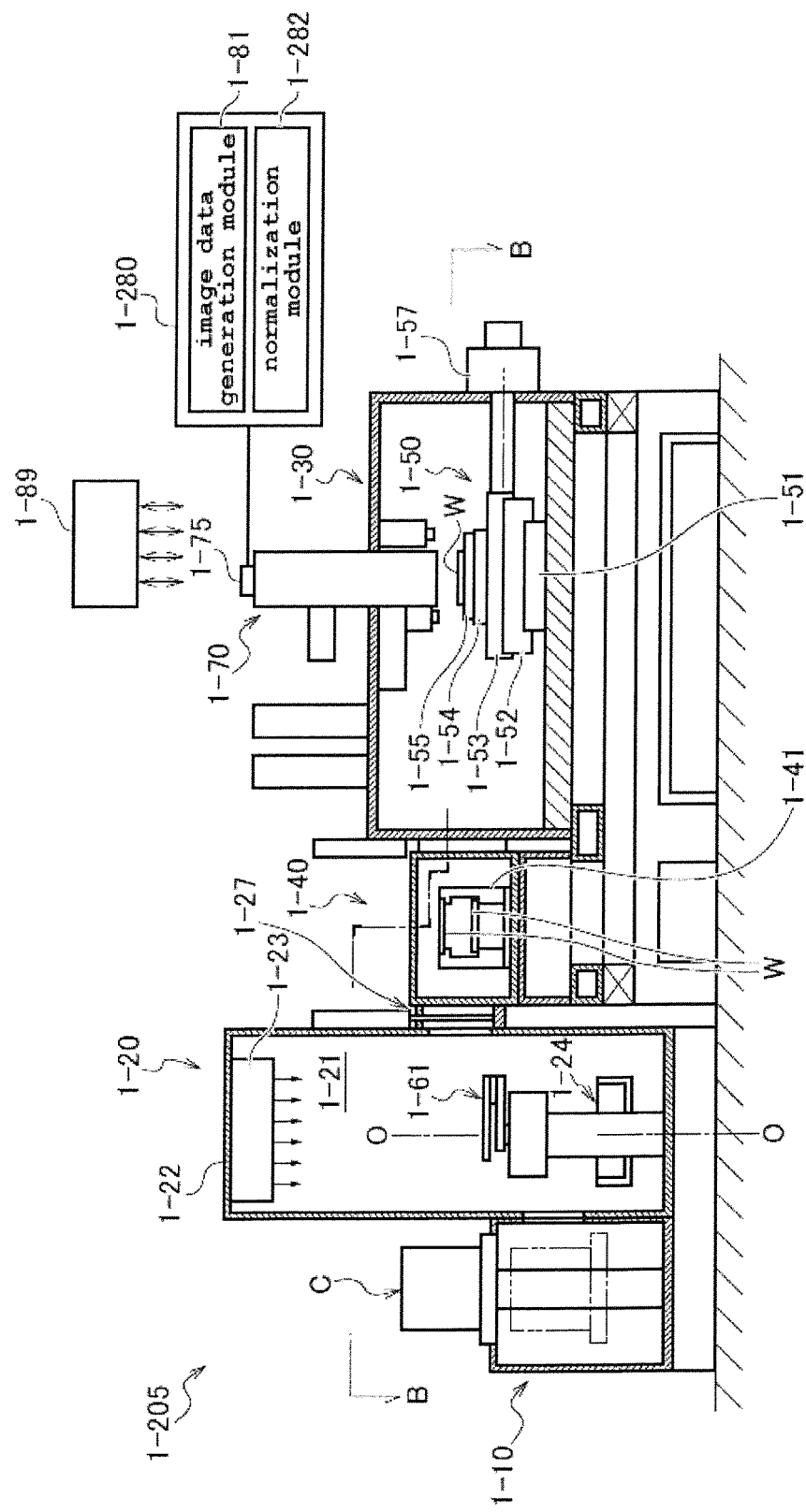
FIG. 11 is a schematic elevation of an inspection system according to the embodiment 1-B.

FIG. 11 shows a schematic configuration of an inspection system 1-205 according to the embodiment 1-B. In FIG. 11, in constituent elements of the inspection system 1-205, like reference numerals will be given to like constituent elements to those of the embodiment 1-A (FIG. 1), and the description thereof will be omitted here. The inspection system 1-205 includes an image processing unit 1-280. This image processing unit 1-280 differs from the image processing unit 1-80 of the embodiment 1-A in that the image processing unit 1-280 also functions as a normalization module 1-282. The function of the normalization module 1-282 will be described later.

Figure 12:
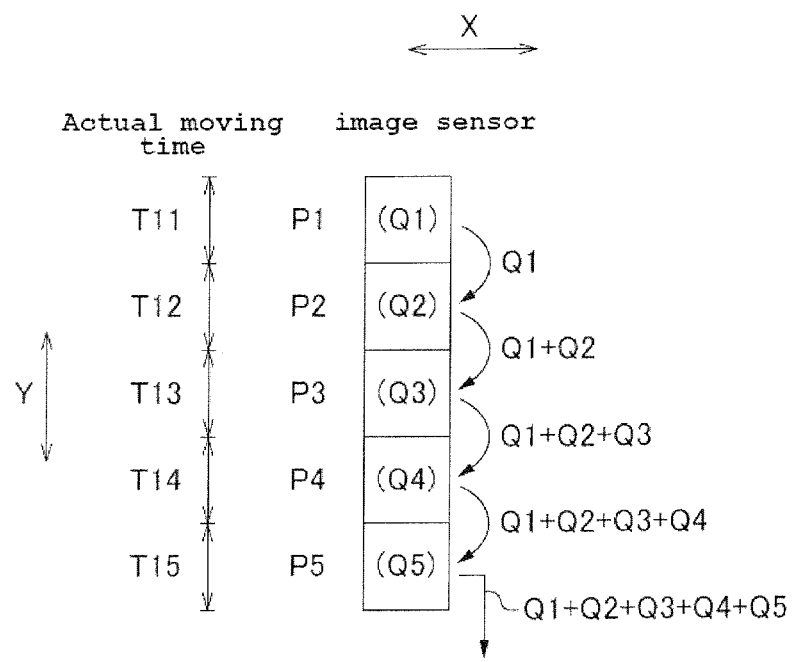
FIG. 12 is an explanatory drawing showing schematically how secondary charged particles are integrated in a TDI sensor.

FIG. 12 shows schematically how the TDI sensor 1-75 integrates amounts of secondary charged particles. Here, as a matter of convenience of description, the TDI sensor 1-75 is described as having five pixels which are aligned in a stack in five stages in the direction Y and no pixel which is aligned in an X direction. In FIG. 12, P1 to P5 denote imaging devices (pixels) which are aligned in the direction Y. In the illustrated example, when detection is executed by the TDI sensor 1-75, a wafer W is moved in a direction directed from the pixel P1 to the pixel P5. In FIG. 12, T11 to T15 denote times (periods of time) actually required for the wafer W to move a distance corresponding to one pixel. For example, the time T11 is a time required for the wafer W to move a distance corresponding to the pixel P1, and the time T12 is a time required for the wafer W to move a distance corresponding to the pixel P2.

As shown in FIG. 12, in the detection by the TDI sensor 1-75, firstly, an electric charge Q1 which corresponds to an amount of secondary electric particles detected is accumulated in the pixel P1 during the time T11. This electric charge Q1 is transferred to the pixel P2 that lies adjacent to the pixel P1 in accordance with a transfer clock that is inputted into the TDI sensor 1-75 at a timing at which the time T11 has just elapsed. An electric charge Q2 is accumulated in the pixel P2 in addition to the electric charge Q1 transferred from the pixel P1 during the time T12 which follows the time T11. As a result of this, the electric charges Q1+Q2 are accumulated in the pixel P2 by the time when the time T12 has elapsed. The electric charges Q1+Q2 are transferred to the pixel P3 at a timing at which the time T12 has just elapsed. An electric charge Q3 is accumulated in the pixel P3 in addition to the electric charges Q1+Q2 which have been transferred from the pixel P2 during the time T13 which follows the time T12. As a result of this, the electric charges Q1+Q2+Q3 are accumulated in the pixel P3 by the time when the time T13 has elapsed. In this way, as a result of the electric charges being accumulated sequentially, the electric charges Q1+Q2+Q3+Q4+Q5 are accumulated in the pixel P5 after the times T11 to T15 have elapsed and are then transferred to the image processing unit 1-280.

In this way, the luminance data that is transferred to the image processing unit 1-280 is normalized by the normalization module 1-282 of the image processing unit 1-280 which executes a normalization process. When referred to herein, normalization is a process of correcting the integrated detection amount so that the influence on the integrated detection value (the unevenness in luminance) is mitigated which is caused by the variation in moving speed of the wafer W (a Y table 1-52), that is, the variation in exposure time of the wafer W. This normalization process is executed based on the time required for the wafer W to move by a distance corresponding to one pixel along the direction Y during the integration at the TDI sensor 1-75. Specifically speaking, the normalization process is executed based on the following expression (1) by the use of a normalization coefficient K which is a ratio of an actual moving time Tn to a target moving time TO. IV0 is an integrated detection amount before normalization, and IV1 is an integrated detection value after normalization.

$$IV1 = K \times IV0 \quad (1)$$

The normalization coefficient K is calculated by the following expression (2). Tn is a time actually required for the wafer W to move by a predetermined distance (hereinafter, also, referred to as an actual moving time). In this embodiment, the predetermined distance is a distance which corresponds to the pixels of the TDI sensor 1-75 which are aligned in a stack in the predetermined number of stages along the direction Y (a distance corresponding to the five pixels in the example shown in FIG. 12). Because of this, the actual moving time Tn equals the exposure time that corresponds to the integrated detection amount that is transferred from the TDI sensor 1-75. The target moving time TO is a time estimated in advance as a time required for the wafer W to move the predetermined distance (hereinafter, also, referred to as a target moving time). The target moving time TO may be taken as a design value for the time required for the wafer W to move the predetermined distance.

$$K = TO/Tn \quad (2)$$

The integrated detection amount that is normalized in this way by the normalization module 1-282 is outputted to an image data generation module 1-81. The image data generation module 1-81 synthesizes the integrated detection values that the image data generation module 1-81 has received from the normalization module 1-282 to generate image data which is made up of gradation values (luminance values) which are aligned in the direction Y and the direction X. It is noted that the sequence of executing the normalization process and the image data generation process may be reversed. Namely, the image data generation module 1-81 may first generate image data by synthesizing the data which is transferred from the TDI sensor 1-75, and thereafter, the normalization module 1-282 may normalize the image data so generated.

Figures 13A, 13B, 13C, 13D, 13E:
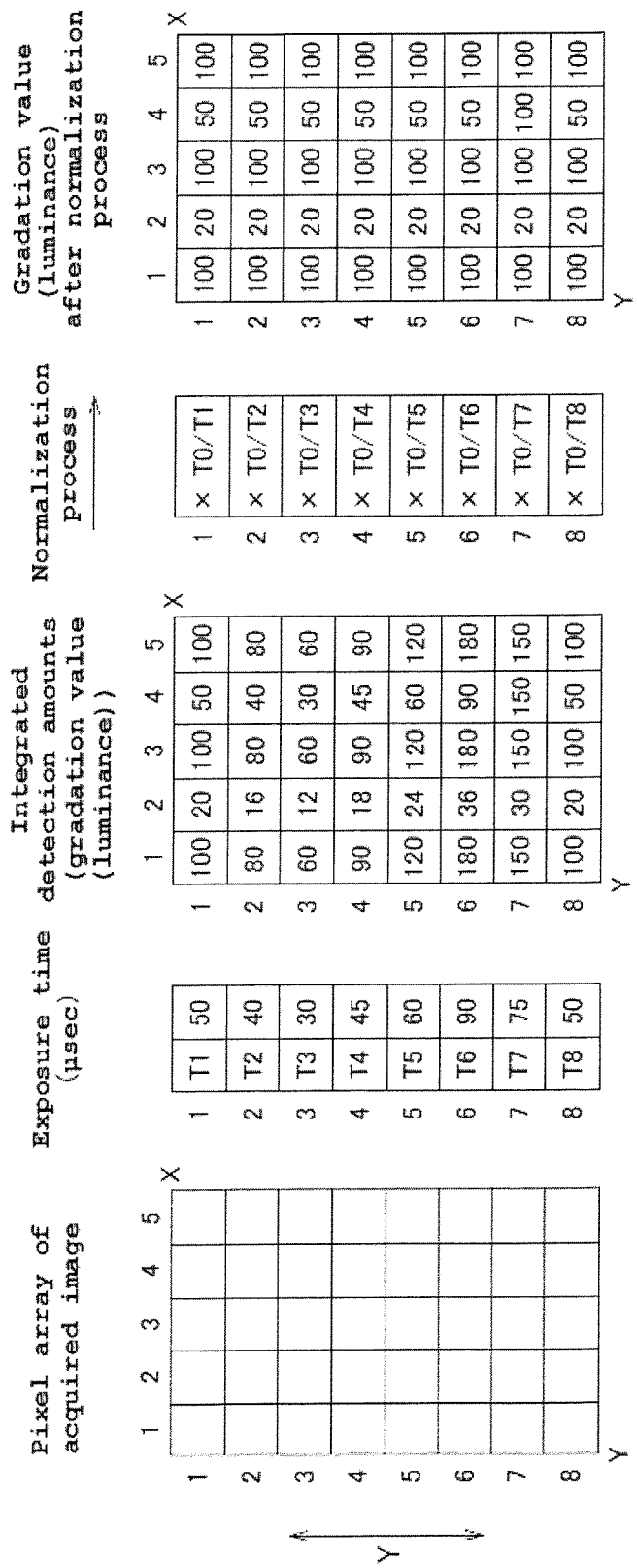
FIGS. 13A to 13E are explanatory drawings showing a specific example of normalization.

FIGS. 13A to 13E show a specific example of the normalization process. In this example, image data is first generated, and thereafter, the generated image data is normalized. FIG. 13A shows a pixel array in image data before normalization. A pixel group of Y=1 is a pixel group which is transferred first to the image processing unit 1-280 by the TDI sensor 1-75. A pixel group of Y=2 is a pixel group which is transferred after the pixel group of Y=1. Namely, a row of numbers in the direction Y denotes the order in which the pixel groups are transferred from the TDI sensor 1-75. FIG. 13B shows total exposure times for the pixel groups arranged in the direction X. For example, an exposure time T1 is a total value of the times T11 to T15 shown in FIG. 12. Namely, the exposure time T1 corresponds to the actual moving time Tn described above. FIG. 13C shows gradation values of the individual pixels which make up the image data generated by synthesizing the integrated detection values. Namely, FIG. 13C shows the integrated detection amounts IV0 before normalization. The integrated detection amounts (the gradation values) IV0 before normalization are luminance values of 256 gradations here. FIG. 13D shows normalization coefficients K which are applied to a pixel group of Y=n (here, n is an integer from 1 to 8). FIG. 13E shows integrated detection values IV1 after normalization which are calculated by an expression (2) based on the normalization coefficients K shown in FIG. 13D.

Figure 14:
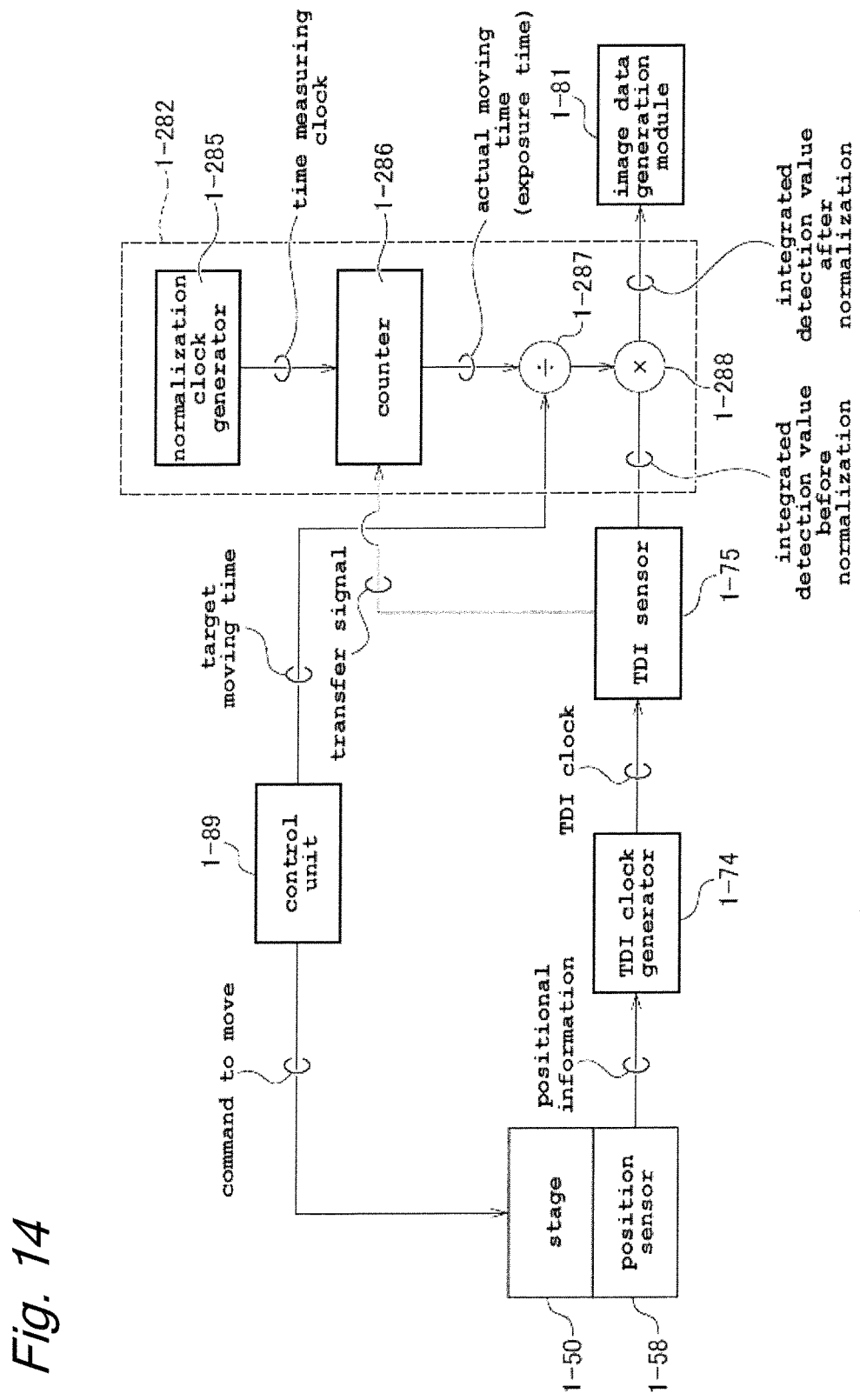
FIG. 14 is a block diagram showing schematically an example of a configuration for normalizing an integrated detection value.

FIG. 14 shows an example of a configuration for realizing the normalization process described above. The example shown is a configuration in which image data is generated after normalization. As shown in FIG. 14, the normalization module 1-282 includes a normalization clock generator 1-285, a counter module 1-286, a divider 1-287, and a multiplier 1-288. When the control unit 1-89 issues a moving command to a stage unit 1-50 (a servo motor 1-56), the Y table 1-52 is moved in the direction Y. A moving amount of the Y table 1-52 is detected by a position detection unit 1-58. Then, the positional information detected by the position detection unit 1-58 is inputted in a TDI clock generator 1-74. The TDI clock generator 1-74 inputs a TDI clock (a transfer clock) into the TDI sensor 1-75 based on the positional information received every time the Y table 1-52 moves one pixel in the direction Y. The TDI sensor 1-57 integrates electric charges in accordance with the TDI clocks and transfers the electric charges which are integrated to a final stage to an A/D conversion module (not shown) incorporated therein. The integrated detection values IV0 before normalization which are converted to digital values by the A/D conversion module are inputted into the multiplier 1-288. Additionally, the TDI sensor 1-75 inputs a transfer signal that signals that the transfer has been executed into the counter module 1-286 every time the amount of secondary charged particles (electric charges) is transferred.

On the other hand, in the normalization module 1-282, the counter module 1-286 measures an actual moving time Tn by the use of a time measuring clock that is generated by the normalization clock generator 1-285. Specifically speaking, the counter module 1-286 measures a time required to receive the transfer signal by a predetermined number of times (five times in the example shown in FIG. 12) in succession most recently by the use of the time measuring clock and inputs the measured time into the divider 1-287 as an actual moving time Tn. The divider 1-287 calculates a normalization coefficient K by the use of the expression (2) above based on a target moving time TO that is inputted from the control unit 1-89 and the actual moving time Tn that is inputted from the counter module 1-286. The normalization coefficient K so calculated is inputted into the multiplier 1-288, whereby a normalization process, that is, an operation based on the expression (1) above is executed in the multiplier 1-288. The results of the operation in the multiplier 1-288, that is, the integrated detection amount IV1 after normalization is inputted into the image data generation module 1-81.

Although not shown, when the image data generating module 1-81 synthesizes the image data transferred from the TDI sensor 1-75 to generate image data, whereafter the normalization module 1-282 normalizes the generated image data, the normalization module 1-282 can normalize the image data as follows, for example. Firstly, the normalization module 1-282 measures actual moving times Tn sequentially or calculates normalization coefficients K sequentially as done in FIG. 14 and stores the actual moving times Tn or the normalization coefficients K so calculated in a buffer. Next, the normalization module 1-282 extracts sequentially the data groups that the normalization module 1-282 receives from the TDI sensor 1-75 in a single transfer from the image data generated by the image data generation module 1-81 in the order in which the normalization module 1-282 receives the data groups from the TDI sensor 1-75. Then, the normalization module 1-282 normalizes the data groups so extracted.

According to the inspection system 1-205 that has been described heretofore, even though the moving speed of the wafer W varies, since the movement of the wafer W over the distance corresponding one pixel coincides completely with the transfer clock, it is possible to cause the projection image that is projected on to the TDI sensor 1-75 to approach the ideal position with good accuracy. Consequently, the wafer W can be inspected with good accuracy. Moreover, the integrated detection value IV0 before normalization that is integrated by the TDI sensor 1-75 is normalized based on the actual exposure time (the actual moving time Tn) of the wafer W. Consequently, even though the moving speed or the exposure time of the wafer W varies, it is possible to generate the image data in which the unevenness in luminance attributed to the variation in exposure time is mitigated. As a result of this, the accuracy of the inspection using the image data can be improved further.

In the normalization described above, the actual moving time Tn which is used in the expression (2) above may be a time required for the wafer W to move only part of the distance which corresponds to the pixels of the TDI sensor 1-75 which are aligned in the predetermined number of stages in the direction Y. As this occurs, the target moving time TO should be set as a time which corresponds to the part of the distance. For example, when the number of stages in the TDI sensor 1-75 in the direction Y is 2048, the actual moving time Tn may be a time required for the wafer W to move a distance corresponding to 2047 pixels. According to this configuration, the generation speed of image data can be enhanced without influencing largely the accuracy of normalization.

The normalization described above may include an operation other than the operation described above. For example, in addition to the operations in the expressions (1), (2) above, a predetermined offset amount may be subtracted from the integrated detection amount IV0 before normalization or the integrated detection amount IV1 after normalization. The subtraction above is executed to remove dark current noise. An integrated detection value that is obtained by executing an imaging in advance by the TDI sensor 1-75 in such a state that no beam is shed onto the wafer W may be used for the offset value. The offset value may be set when the inspection system 1-205 is actuated or may be set every time a predetermined number of wafers W are inspected. According to this configuration, it is possible to generate the accurate image data in which the influence of dark current noise is reduced. As a result of this, the accuracy of the inspection which utilizes the image data can be improved.

Alternatively, in the normalization, in addition to the operations in the expressions (1), (2) above, the integrated detection value may be multiplied by the increase or decrease ratio which is determined in advance for each imaging device group which is made up of the imaging devices which are aligned along the direction Y. This multiplication is executed to correct the variation in acceptance sensitivity of each imaging device group. The increase or decrease ratio by which the integrated detection value is multiplied may be set so that the variation in the integrated detection values in the direction X is mitigated which are obtained by shedding light from the same light source onto the individual pixels of the TDI sensor 1-75 for imaging in advance. In addition, in the normalization, a coefficient in which the normalization coefficient K is multiplied by the increase or decrease ratio in advance may be used in place of using the normalization coefficient K. According to this configuration, since the variation in acceptance sensitivity for each imaging device group is corrected, the accuracy of the inspection which utilizes the image data can be improved.

The invention is not limited to the configuration in which the integrated detection amounts which are expressed by digital values are normalized. Hence, in the normalization process, the integrated detection amounts which are expressed by analog values may be normalized. A real time analog calculation unit may be made use of for normalization of the analog values. As this occurs, the integrated detection values are A/D converted after normalization. According to this configuration, since the normalization is executed in such a state that no quantization error is contained, the accuracy of the image data can be enhanced.

In the embodiment described above, although the normalization module 1-282 is described as being part of the image processing unit 1-280, the normalization module 1-282 may be provided in an arbitrary position in the whole of the inspection system 1-205. For example, the normalization module 1-282 may be configured as an intermediate processing module which is provided between the TDI sensor 1-75 and the image processing unit 1-280. Alternatively, the normalization module 1-282 may be configured as a signal processing module (for example, FPGA (Field Programmable Gate Array)) that the TDI sensor 1-75 includes.

1-C. Embodiment 1-C

In an embodiment 1-C, the same EO correction as that described in the embodiment 1-B that has been described above is executed. Namely, a target position in the EO correction is set in the same way as that in which the target position TP2 is set in FIG. 10. A transfer clock is inputted into a TDI sensor 1-75 every time a wafer W moves by a distance corresponding to one pixel in a direction Y. In addition, an inspection system according to the embodiment 1-C includes an electron optical unit 1-370 in place of the electron optical unit 1-70 (refer to FIG. 3) of the embodiment 1-A.

Figure 15:
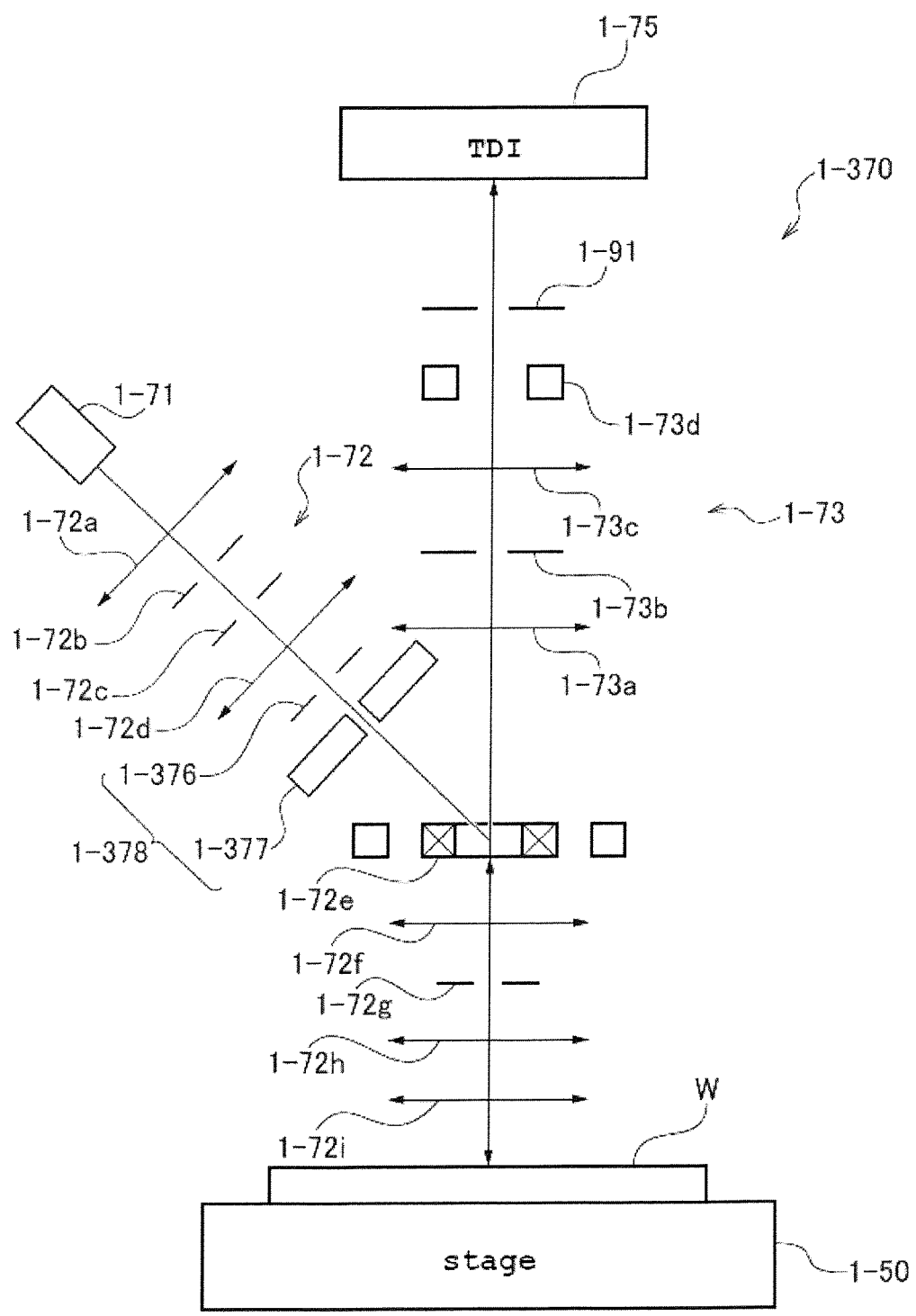
FIG. 15 is a schematic drawing showing a schematic configuration of an electron optical unit according to an embodiment 1-C.

FIG. 15 shows a schematic configuration of the electron optical unit 1-370. In FIG. 15, like reference numerals are given to like constituent elements to those of the embodiment 1-A (FIG. 3). In addition to the configuration shown in FIG. 3, the electron optical unit 1-370 includes a prevention module 1-378. The prevention module 1-378 includes a blanking electrode 1-376 and a blanking aperture 1-377. The blanking electrode 1-376 blanks an electron beam that is shed from a light source 1-71 and that passes through a lens 1-72d. Specifically, the blanking electrode 1-376 deflects the electron beam to an outer side of an opening portion of the blanking aperture 1-377 at a high speed so as to control so that the electron beam does not reach an ExB filter 1-72*e*. According to this prevention module 1-378, even though the moving speed of a wafer W is not constant, the exposure time of the wafer W during an interval at which an integrated detection amount is transferred from the TDI sensor 1-75 can be controlled to be uniform.

Figure 16:
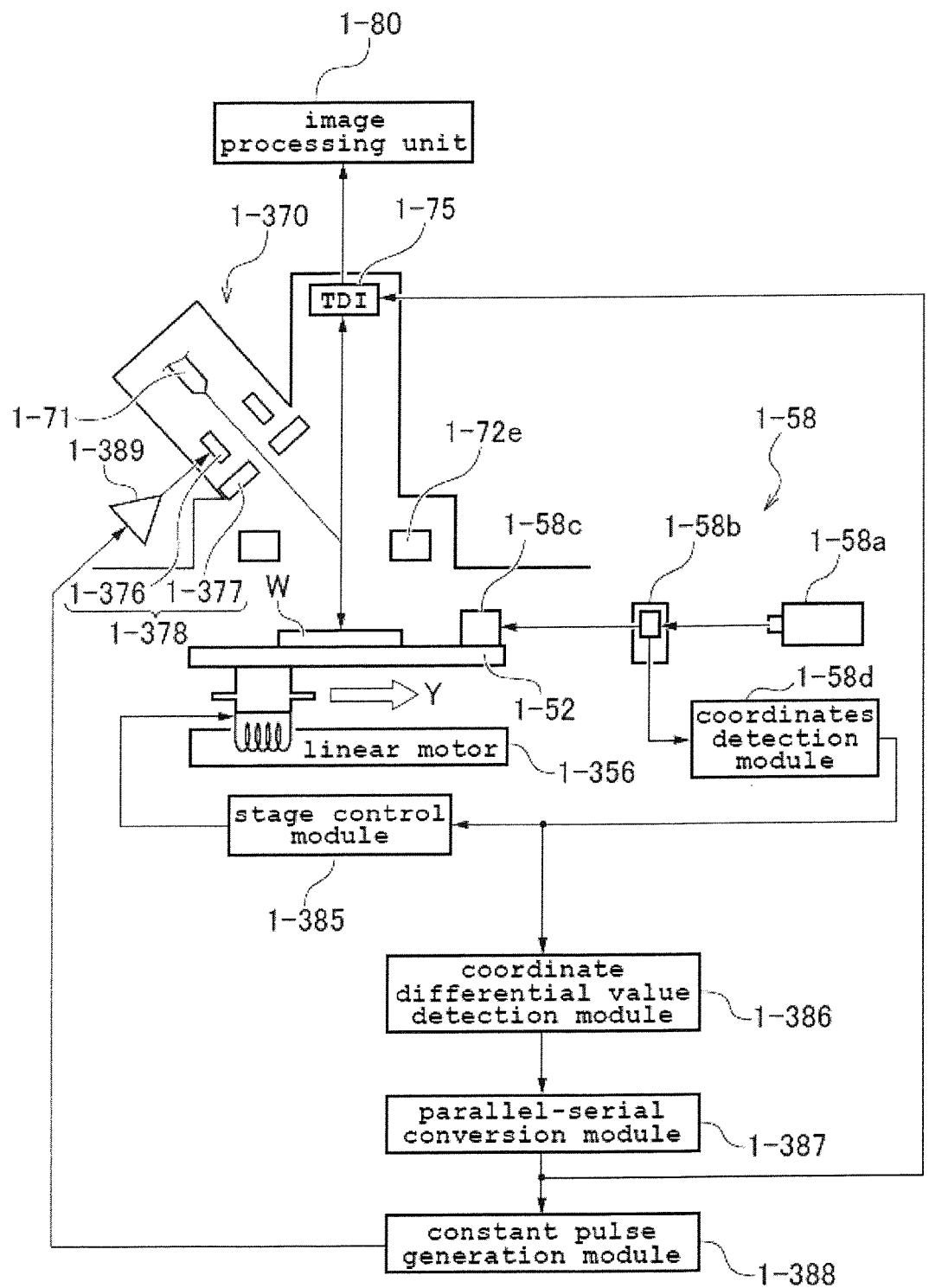
FIG. 16 is an explanatory drawing showing a schematic configuration for controlling an exposure time of an inspection target.

FIG. 16 shows an example of a configuration for controlling the exposure time of the wafer W. In FIG. 16, the configurations of a stage unit 1-50 and the electron optical unit 1-370 are illustrated schematically. In addition, in this embodiment, in place of the servo motor 1-56, a linear motor 1-356 is adopted as an actuator which moves the wafer W in a direction Y. As shown in the figure, the wafer W moves in the direction Y as a result of a Y table 1-52 being moved by the linear motor 1-356. A moving amount of the wafer W is measured by a position detection unit 1-58 as described above. Specifically speaking, the position detection unit 1-58 includes a laser oscillator 1-58*a* as a light source, a laser interferometer 1-58*b*, a mirror plate 1-58*c* which is fixed to the Y table 1-52 (or a holder 1-55), and a coordinates detection module 1-58*d*. Light shed from the laser oscillator 1-58*a* passes through the laser interferometer 1-58*b* to be shed on to the mirror plate 1-58*c*, and the light reflected thereon returns to the laser interferometer 1-58*b*. The laser interferometer 1-58*c* detects a difference in phase between the incident wave from the laser oscillator 1-58*a* and the reflected wave from the mirror plate 1-55*c* and inputs it into the coordinates detection module 1-58*d*. The coordinates detection module 1-58*d* detects coordinates of the wafer W or, strictly speaking, coordinates of the Y table 1-52 (or the holder 1-55) based on the phase difference so inputted.

Coordinate values detected by the coordinates detection module 1-58*d* are fed back to a stage control module 1-385 which controls the stage unit 1-50 and is also inputted into a coordinate differential value detection module 1-386. The coordinate differential value detection module 1-386 calculates a difference between the coordinate values inputted this time and the coordinate values inputted previously and inputs the difference so calculated into a parallel-serial conversion module 1-387. The parallel-serial conversion module 1-387 inputs a serial transfer pulse into the TDI sensor 1-75 based on the coordinate values inputted as parallel digital values at a timing at which the wafer W moves by a distance corresponding to one pixel of the TDI sensor 1-75. This transfer pulse is also inputted into a constant pulse generation module 1-388.

Every time it receives the transfer pulse, the constant pulse generation module 1-388 inputs a blanking signal into an amplifier 1-389. The blanking signal is a pulse having a pulse width of a constant time. This blanking signal is reversed between a high (H) level and a low (L) level by the amplifier 1-389 and is inputted into the blanking electrode 1-376. When the blanking signal which is at the high lever is applied to the blanking electrode 1-376, the blanking electrode 1-376 deflects the electron beam to the outer side of the opening portion in the blanking aperture 1-377. Namely, although the electron beam is shed towards the wafer W during a period of time when the blanking signal is at the high level, the arrival of the electron beam at the wafer W side is prevented by the blanking electrode 1-376 and the blanking aperture 1-377 during a period of time when the blanking signal is at the low level. In this embodiment, the stage control module 1-385, the coordinate differential value detection module 1-386, the parallel-serial conversion module 1-387 and the constant pulse generation module 1-388 are included in a control unit 1-89 (refer to FIG. 1). However, at least part of these functions may be performed by modules provided separately from the control unit 1-89.

Figure 17:
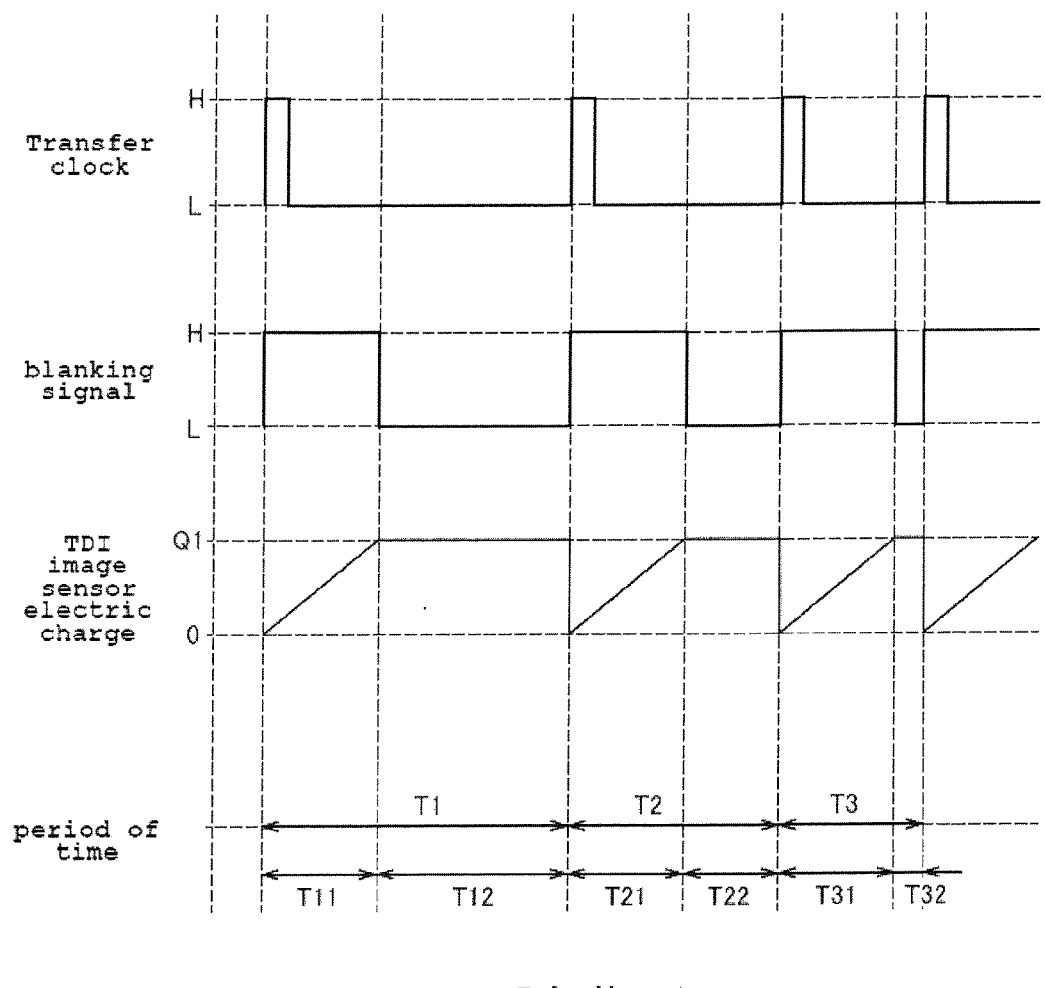
FIG. 17 is a timing chart showing timings at which a beam is shed to an inspection target in the embodiment.

FIG. 17 shows timings at which the electron beam is shed on to the wafer W in the inspection system of the embodiment 1-C. The wafer W here is understood to have no defect or foreign matter adhering thereto. Namely, amounts of secondary charged particles obtained from the wafer W are uniform over the whole area of the wafer W. As shown in FIG. 17, in a period of time T1 from the generation of a first transfer clock to the generation of a second transfer clock which follows the first transfer clock, that is, a period of time during which the wafer W moves by a distance corresponding to one pixel, the blanking signal stays at the high level during a period of time T11 which starts at a timing at which the first transfer clock rises. In this period of time T11, since the electron beam is shed on to the wafer W, an amount of electric charges accumulated in a first pixel of the TDI sensor 1-75 increases at a constant speed from zero to an electric charge Q1. Thereafter, in the remaining period of time T12 in a period of time T1, since the blanking signal stays at the low level, the arrival of the electron beam at the wafer W side is prevented. Because of this, in the period of time T12, the amount of electric charges accumulated in the first pixel of the TDI sensor 1-75 is maintained at the electric charge Q1. Since this electric charge Q1 is transferred to a second pixel lying adjacent to the first one when a second transfer clock is generated, the amount of electric charges is reset to zero when a period of time T2 starts which extends from the generation of the second transfer clock until the generation of a third transfer clock which follows the second transfer clock. In this embodiment, a period of time T2 is shorter than the period of time T1. Namely, the moving speed of the wafer W is varying.

Next, in the period of time T2, the blanking signal stays at the high level during a period of time T21 which starts at a timing at which the second transfer clock rises. As has been described above, since the pulse width of the blanking signal is constant, the period of time T11 and the period of time T21 are the same in terms of length. Because of this, in the period of time T21, as in the case with the period of time T11, the amount of electric charges accumulated in the first pixel increases at the constant speed from zero to the electric charge Q1. Thereafter, in the remaining period of time T22 in the period of time T2, since the blanking signal stays at the low level, the arrival of the electron beam at the wafer W side is prevented. Because of this, the amount of electric charges accumulated in the first pixel remains at the electric charge Q1 and is transferred to the second pixel after the elapse of the period of time T2. Although a description thereof is omitted, also, in a period of time T3 that is shorter than the period of time T2, the electric charge Q1 is accumulated in the first pixel. Although the rise of the transfer clock and the rise of the blanking signal are described as being the same in this example, the blanking signal may rise after the elapse of a certain period of time since the rise of the transfer clock. In this way, irrespective of the moving speed of the wafer W that varies, the time during which the electron beam is shed on to the wafer W becomes constant.

Figure 18:
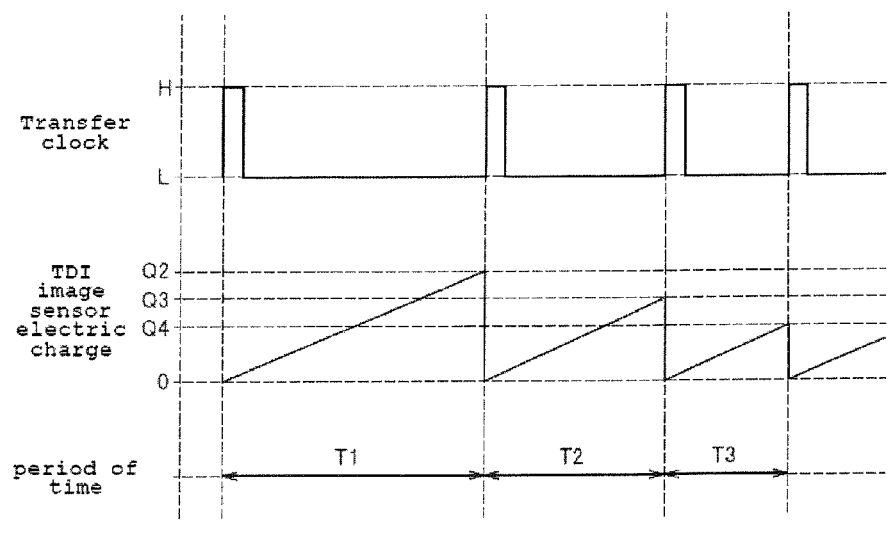
FIG. 18 is a timing chart showing timings at which a beam is shed to an inspection target in a comparison example.

On the other hand, when the inspection system 1-5 does not have the prevention module 1-378, as shown in FIG. 18, electric charges Q2, Q3, Q4 which are accumulated in the first pixel in periods of time T1, T2, T3 are proportional to the exposure time and Q2>Q3>Q4. Namely, even in the case of there being no area distribution in the surface properties of the wafer W, the moving speed of the wafer W varies, whereby the amount of electric charges does not stay constant.

In the inspection system described above, it is desirable that in consideration of a variation in time required for the wafer W to move by the distance corresponding to one pixel of the TDI sensor 1-75, the pulse width of the blanking signal is set to be as wide as possible within a range which does not exceed a minimum value of the variation range. By adopting this setting, it is possible to extend the exposure time within the range where the exposure time of the wafer W in the individual positions thereof can be maintained uniform. As a result of this, a fast imaging is executed at the TDI sensor 1-75. Normally, the speed variation of the stage unit 1-50 falls within a range of 1% to 0.1%. In many cases, the value of this speed variation is specified based on a maximum speed, and the speed variation increases as the moving speed of the stage unit 1-50 slows. For example, when the moving speed is 30 mm/s and the degree of variability of moving speed is 1%, in many stage units, the degree of variability of moving speed becomes roughly 10% when the moving speed is 3 mm/s. As one of factors which cause this, the fact is raised that the loop gain of the servo is constant irrespective of the moving speed of the wafer W. In order to maintain the luminance constant irrespective of the degree of variability of moving speed, it is desirable that the pulse width of the blanking signal is determined in consideration of the period of the transfer pulse of the TDI sensor 1-75 which is shortened by the variation in moving speed. Additionally, in order to ensure the number of secondary electric charges to be detected, it is desirable that the shedding time in one period is extended as long as possible. Assuming that the average transfer pulse period when the moving speed is slow is t1, the range of the transfer pulse period becomes t1±10%. Although there is no problem in the event that the transfer pulse period is long, when the transfer pulse period becomes short, there may be caused a situation in which the variation cannot be absorbed. In addition, it is desirable that the rising time and falling time of the pulse and the response time of the blanking mechanism be taken into consideration. Then, it is considered that for example, roughly 80% of the average transfer pulse period is allocated to the shedding time in one period, that is, to the pulse width of the blanking signal, while the remaining 20% is allocated to a margin for absorbing the variation in moving speed. Of course, this ratio results when the degree of variability of the stage moving speed is taken as a predetermined example to enable the absorption of the variation in moving speed. When a stage is used whose degree of variability in moving speed is smaller, suitable values should be applied thereto based on the same consideration.

According to the inspection system that has been described above, even though the moving speed of the wafer W varies, since the movement of the wafer W over the distance corresponding to one pixel is synchronized completely with the transfer clock, it is possible to cause the projection image that is projected on to the TDI sensor 1-75 to approach the ideal position with good accuracy. Consequently, it is possible to inspect the wafer W with god accuracy. Moreover, the time during which the electron beam is shed on to the wafer W becomes constant irrespective of the moving speed of the wafer W, and therefore, the amount of electric charges that are accumulated in the pixels of the TDI sensor 1-75 becomes constant at all times when there exists no area distribution in the surface properties of the wafer W. Consequently, even though the moving speed of the wafer W varies, that is, the exposure time varies, it is possible to generate the image data in which the unevenness in luminance attributed to the variation in exposure time is mitigated. As a result of this, the accuracy of the inspection using the image data can be improved further.

The inspection system described above may include a monitoring module which monitors the moving speed of the wafer W, in other words, the moving speed of the holder 1-55 or the Y table 1-52. The moving speed can easily be grasped by using the results of a measurement by the position detection unit 1-58. Additionally, the inspection system may include a setting module which sets the pulse width of the blanking signal based on the results of the monitoring of the moving speed of the holder 1-55 or the Y table 1-52 by the monitoring module. This setting module may try to move the Y table 1-52 experimentally before the wafer W is imaged so as to set the pulse width of the blanking signal based on the results of the monitoring by the monitoring module during the trial movement. According to this configuration, in mass producing inspection systems, the pulse width of the blanking signal can be set to a preferred value according to individual differences in moving properties of the Y tables 1-52. Alternatively, the pulse width of the blanking signal may be reset based on the results of the monitoring by the monitoring module carried out until then at a predetermined timing, for example, every predetermined period of time or every time a predetermined number of wafers W are imaged. According to this configuration, when a variation is caused in the moving properties of the Y table 1-52, too, the pulse width of the blanking signal can be set to a preferred value. The monitoring module and the setting module may be configured as part of the control unit 1-89.

The position of the prevention module 1-378 is not limited to the position described in the embodiment above, and hence, the prevention module 1-378 may be provided in any position as long as either of the arrival of the electron beam at the wafer W side and the arrival of the secondary charged particle at the TDI sensor 75 is realized in that position. For example, the prevention module 1-378 may be provided between the TDI sensor 1-75 and the secondary optical system 1-73 or may be provided between the stage unit 1-50 and the secondary optical system 1-73.

The prevention module 1-378 can have, in addition to the blanking module, any configuration which can prevent the arrival of the beam at the wafer W side or the arrival of the secondary charged particle at the TDI sensor 1-75. For example, when an electromagnetic wave is emitted from the light source 1-71, the prevention module 1-78 may be a movable shutter which cuts off electromagnetic waves.

1-D. Modified Example 1-D

1-D-1: Modified Example 1-D-1

The target positions in the EO corrections are not limited to those described in the embodiments described above. When expressing the target position by an orthogonal coordinate system in which the axis of abscissas represents time and the axis of ordinates represents target position, any target position should be adopted, provided that the target position is set into a step-and-riser shape in which the target position is kept staying in the same position by a predetermined period of time which is equal to or shorter than a period of time from an input of one transfer clock until an input of the following clock (hereinafter, also referred to as a transfer interval period) and thereafter rises by a predetermined distance. For example, the target position may be set so that the target position is kept staying in the same position by a period of time which is shorter than the transfer interval period (for example, the period of time T2 in FIG. 5) in relation to the conventional target position TP0 shown in FIG. 5 and thereafter rises in parallel to the axis of ordinates so as to return to a point on the line representing the conventional target position TP0. In addition, when referred to herein, the "step-and-riser shape" is not limited to the configuration in which the target position rises in parallel to the axis of ordinates, and hence, the target position may be inclined in relation to the axis of ordinates. Even in these configurations, compared with the conventional EO correction in which the target position is set to the target position TP0, it is possible to suppress the risk of the projection image moving away from the ideal position, thereby making it possible to improve the inspection accuracy.

1-D-2. Modified Example 1-D-2

The inspection system described above may be such that an electromagnetic wave (light) is shed on to the inspection target and a secondary electromagnetic wave reflected on the inspection target, that is, the reflected light is imaged in the TDI sensor 1-75. As this occurs, the secondary optical system that guides the reflected light to the TDI sensor 1-75 may include a deflector which causes a focal point of the secondary electromagnetic wave to deviate. This deflector corresponds to the deflector 1-90 of the embodiment 1-A, and includes, for example, a movable lens and an actuator. The deflector drives the actuator to move the movable lens in a direction which is at right angles to the axis of the secondary magnetic wave to thereby cause the focal point of the secondary electromagnetic wave to deviate. This deflector realizes the same function as the EO correction in the embodiment 1-A, and a deflection amount can be determined by the same configuration as that of the EO correction circuit 1-94 of the embodiment 1-A.

2. Second Embodiment Group

According to a first embodiment of a second embodiment group of the invention, an inspection system is provided. This inspection system includes a primary optical system that has an electron source that sheds charged particles in the form of a beam, a current detection unit that detects an emission current value of the beam shed from the electron source, an imaging unit that has an imaging device that detects an amount of secondary charged particles that are obtained by shedding the beam on to an inspection target, an image data generation unit that generates image data based on the results of the imaging by the imaging unit, and a correction unit that corrects the results of the imaging or the image data based on the emission current value so detected.

According to the inspection system configured as described above, even though the emission current value varies, the results of the imaging or the image data can be corrected so that the influence imposed on the image data in association with the variation in emission current value is mitigated. Consequently, it is possible to suppress the generation of unevenness in luminance that is caused in association with the variation in emission current value.

According to a second embodiment of the second embodiment group, in the first embodiment, the correction unit executes the correction based on a target value that is predetermined in relation to the emission current value and the detected emission current value. According to this embodiment, the image data can be corrected so that the image data is caused to approach image data that is obtained when the emission current value coincides with the target value. Consequently, it is possible to suppress the generation of unevenness in luminance while controlling the luminance value of the image data to a desired level.

According to a third embodiment of the second embodiment group, in the second embodiment, the correction unit executes a correction so as to increase a luminance value that the results of the imaging or the image data exhibits in the event that the detected emission current value is smaller than the target value. According to this embodiment, in the event that the emission current value varies to be smaller than the desired level, it is possible to suppress the generation of unevenness in luminance that is caused in association with the variation.

According to a fourth embodiment of the second embodiment group, in the second or third embodiment, the correction unit executes a correction so as to decrease a luminance value that the results of the imaging or the image data exhibits in the event that the detected emission current value is larger than the target value. According to this embodiment, in the event that the emission current value varies to be larger than the desired level, it is possible to suppress the generation of unevenness in luminance that is caused in association with the variation.

According to a fifth embodiment of the second embodiment group, in any one of the first to fourth embodiments, the detection system includes further a feedback control unit that executes a feedback control based on the detected emission current value so that the variation in emission current value is suppressed. According to this embodiment, since the variation in emission current value is suppressed, it is possible to suppress further the generation of unevenness in luminance.

According to a sixth embodiment of the second embodiment group, the inspection system includes further a movable unit that can hold an inspection target to move the inspection target through a position where the beam is shed by the primary optical system in a predetermined direction. The imaging unit includes a TDI sensor having imaging devices like the imaging device that are aligned in a predetermined number of stages in a predetermined direction and configured to integrate amounts of secondary charged particles that are obtained by shedding the beam on to the inspection target while moving the movable unit in the predetermined direction through a time delay integration system along a predetermined direction. According to this embodiment, it is possible to suppress the generation of unevenness in luminance also when a fast imaging is executed by use of the TDI sensor.

According to a seventh embodiment of the second embodiment group, in the sixth embodiment, the correction unit corrects, based on a mean value of emission current values that are detected by the current detection unit during a period of integration during which amounts of secondary charged particles are integrated by the number of stages aligned in the TDI sensor, the results of the imaging or the image data corresponding to the amounts of secondary charged particles that are integrated during the period of integration. According to this embodiment, since the period of time during which the image of a predetermined area of the inspection target is projected on to the TDI sensor coincides with the period of time during which an emission current value that is used to correct the predetermined area is detected, a good correction accuracy is obtained, as a result of which it is possible to suppress the generation of unevenness in luminance well.

According to an eighth embodiment of the second embodiment group, a inspection image data generation method is provided. This method includes a step of shedding charged particles from an electron source on to an inspection target in the form of a beam, a step of detecting an emission current value of a beam shed from the electron source, a step of detecting an amount of secondary charged particles obtained by shedding the beam on to the inspection target, a step of generating image data based on the results of the detection of the amount of secondary charged particles, and a step of correcting the results of the detection of the amount of secondary charged particles or the image data based on the detected emission current value. According to this method, the same advantage as that provided by the first embodiment can be provided. It is possible to add any one of the second to seventh embodiments to the eighth embodiment.

The invention can be realized in various forms such as an inspection image data generation system, an inspection image data correction system, a program for generating inspection image data and the like, in addition to the second embodiment group described above. The second embodiment group will be described in greater detail by reference to a specific embodiment.

2-A. Embodiment 2-A

Figure 19:
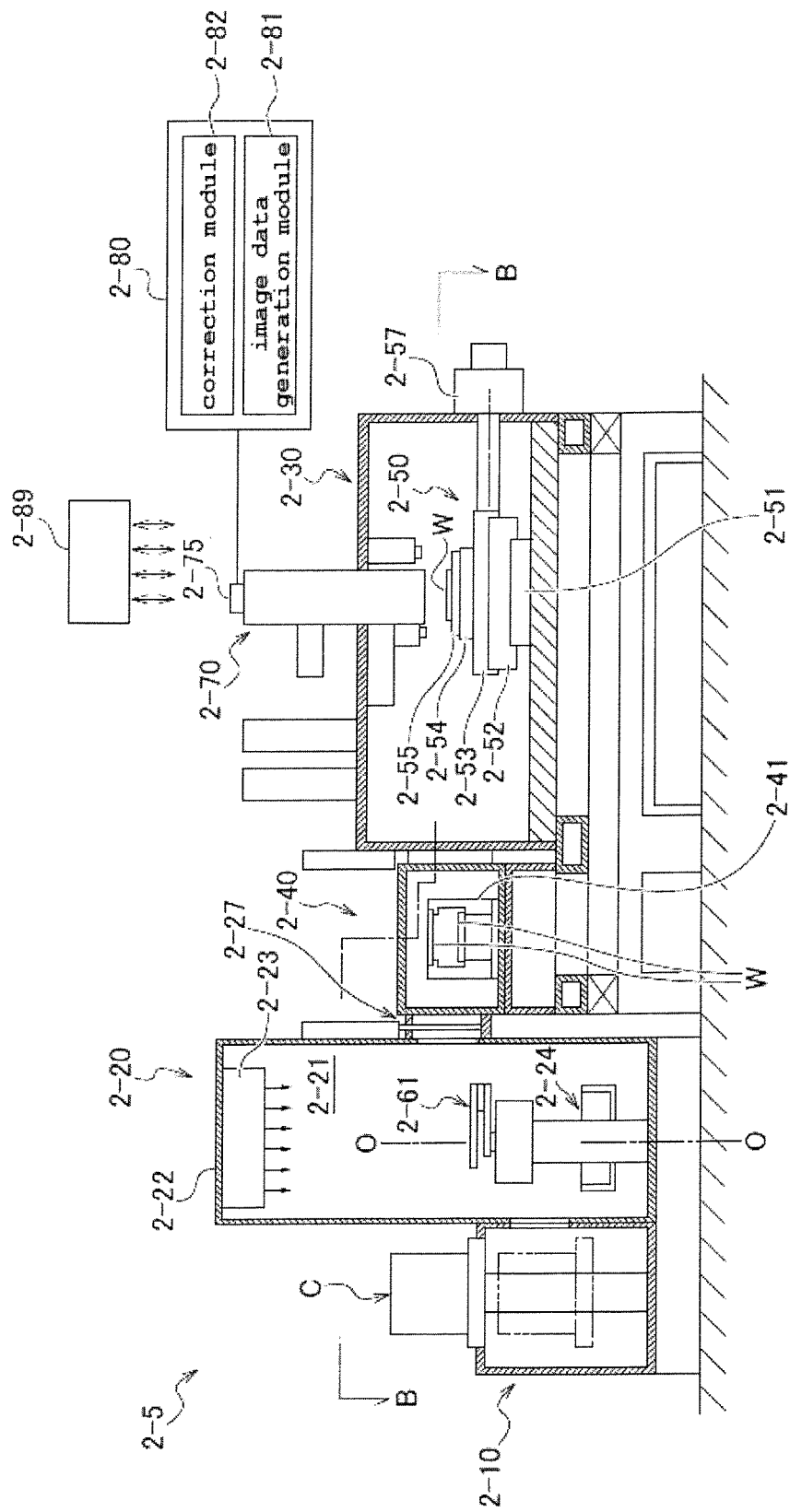
FIG. 19 is a schematic elevation of an inspection system according to a second embodiment group.
Figure 20:
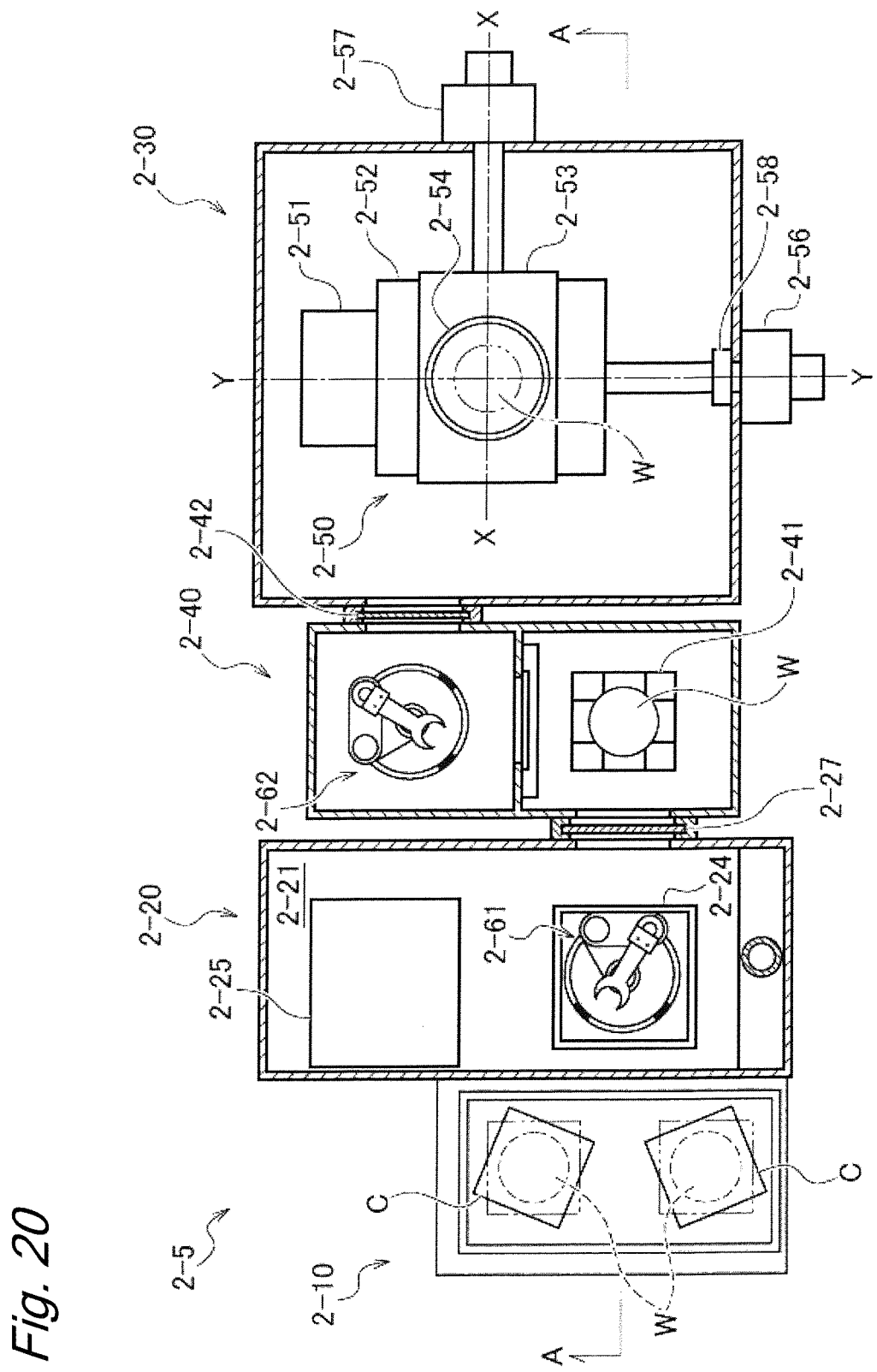
FIG. 20 is a schematic plan view of the inspection system shown in FIG. 19.

FIG. 19 shows a schematic configuration of a semiconductor inspection system (hereinafter, also referred to simply as an inspection system) 2-5 which constitutes an embodiment of an inspection system of the invention. FIG. 19 is a schematic elevation of the inspection system 2-5 and corresponds to FIG. 1. FIG. 20 is a schematic plan view (as seen in a direction indicated by arrows B-B in FIG. 19) of the inspection system shown in FIG. 19. FIG. 20 corresponds to FIG. 2. In FIGS. 19, 20, like reference numerals will be given to like constituent elements to those described in FIGS. 1, 2. In the following description, the repetition of similar descriptions to those made in relation to the constituent elements shown in FIGS. 1, 2 will be omitted, and hence, only constituent elements will be described which differ from the constituent elements shown in FIGS. 1, 2. The inspection system 2-5 differs from the inspection system 1-5 shown in FIGS. 1, 2 in that in contrast to the image processing unit 1-80 of the inspection system 1-5, an image processing unit 2-80 doubles as a correction module 2-82. The function of the correction module 2-82 will be described later.

Figure 21:
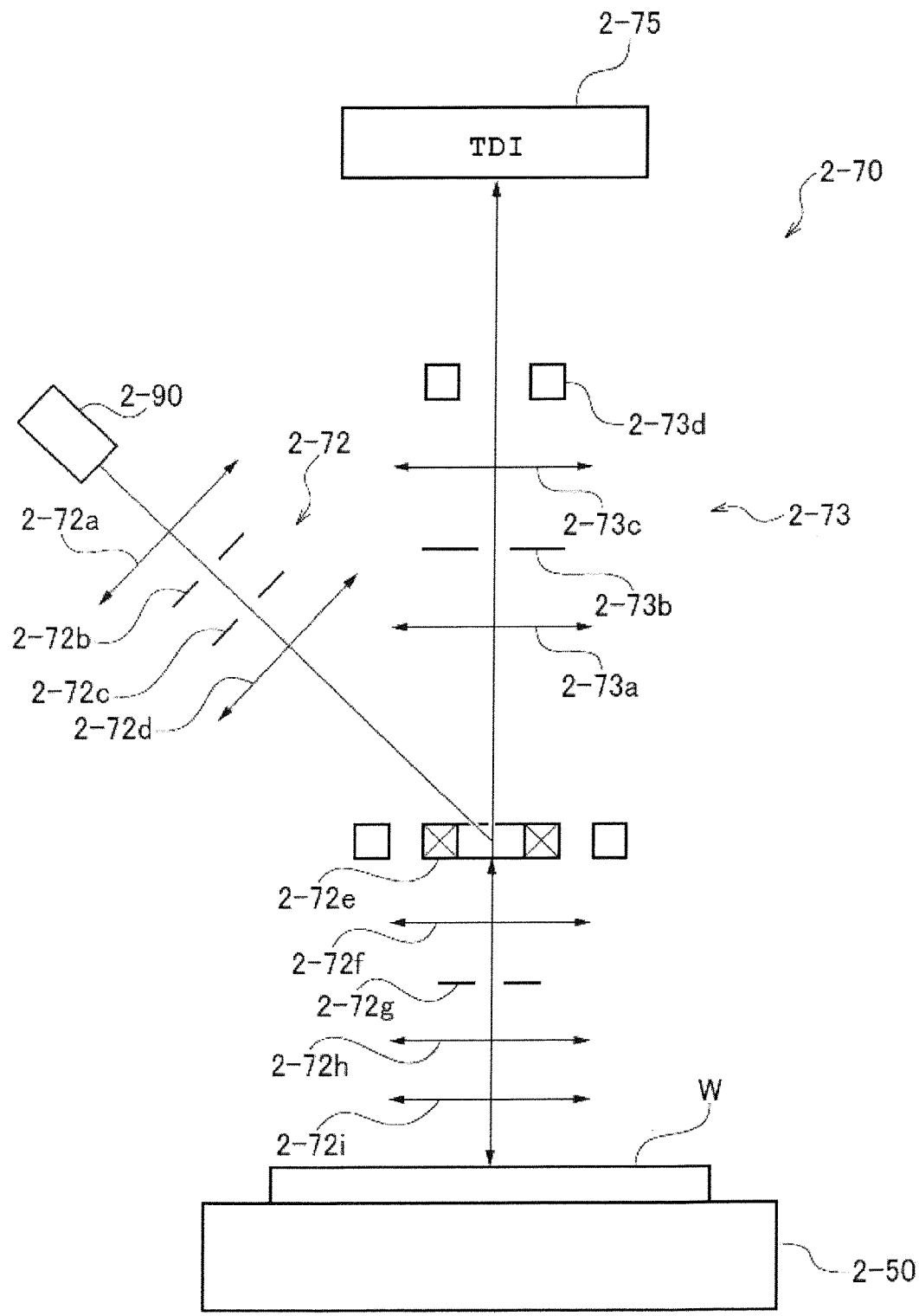
FIG. 21 is an explanatory drawing showing a schematic configuration of an electron optical unit.

FIG. 21 shows a schematic configuration of an electron optical unit 2-70. In this embodiment, the electron optical unit 2-70 is an image projecting electron microscope that sheds an electron beam over the whole of a wide surface of an inspection target at one time to detect an amount of secondary charged particles that are obtained by shedding the electron beam on to the inspection target altogether at one time. However, the electron optical unit 2-70 may be one of other types of electron microscopes such as a scanning electron microscope in which the surface of the inspection target is scanned with a thin contracted electron beam, and an amount of secondary charged particles that are obtained as a result of the scanning is detected to be acquired by one pixel which corresponds to a diameter of the electron beam. As shown, the electron optical unit 2-70 includes a primary optical system 2-72, a secondary optical system 2-73, and a TDI sensor 2-75. The primary optical system 2-72 generates charged particles in the form of a beam and sheds the beam on to a wafer W held by a holder 2-55. The primary optical system 2-72 includes an electron source 2-90, lenses 2-72a, 2-72d, apertures 2-72b, 2-72c, an ExB filter 2-72e, lenses 2-72f, 2-72h, 2-72i, and an aperture 2-72g. In FIG. 21, like reference numerals to those given in FIG. 3 will be given to like constituent elements to those shown in FIG. 3. Hereinafter, the repetition of similar descriptions to those made in relation to the constituent elements shown in FIG. 3 will be omitted, and hence, only constituent elements will be described which differ from the constituent elements shown in FIG. 3. The electron optical unit 2-70 differs from the electron optical unit 1-70 in that the deflection electrode 1-91 is not provided and in that the electron source 2-90 is provided in place of the light source 1-71. The electron source 2-90 is an electron gun which generates electron beams, and the details thereof will be described later.

As with the inspection system 1-5, the inspection system 2-5 can generate luminance data that can be used in inspection of a wafer W. However, in the event that an emission current of an electron beam shed from the electron source 2-90 varies, an amount of secondary charged particles also varies. Therefore, unevenness in luminance that is independent from the existence or non-existence of a foreign matter is generated in the luminance data obtained by the TDI sensor 2-75.

The inspection system 2-5 of this embodiment includes two configurations which can suppress the generation of unevenness in luminance associated with the variation in the amount of secondary charged particles. One is a configuration in which a feedback control is executed on emission current values, and the other is a configuration in which a correction process is executed. In this embodiment, the correction process is a process in which the luminance value is corrected in relation to the results of imaging by the TDI sensor 2-75 based on an emission current value detected by an emission current meter 2-96 (refer to FIG. 22, which will be described later). This correction process is executed by the correction module 2-82 of the image processing unit 2-80. An integrated detection value in which the luminance is corrected by the correction module 2-82 is outputted to an image data generation module 2-81. The image data generation module 2-81 synthesizes the integrated detection values received from the correction module 2-82 to generate image data which is made up of gradation values (luminance values) which are aligned in a direction X and a direction Y. The sequence of the correction process and the image data generation process may be reversed. Namely, the image data generation module 2-81 generates image data by synthesizing the data transferred from the TDI sensor 2-75, and thereafter, the correction module 2-82 may execute a correction process on the image data so generated. Additionally, only the correction process may be executed by omitting the feedback control. Hereinafter, the feedback control and the correction process will be described.

Figure 22:
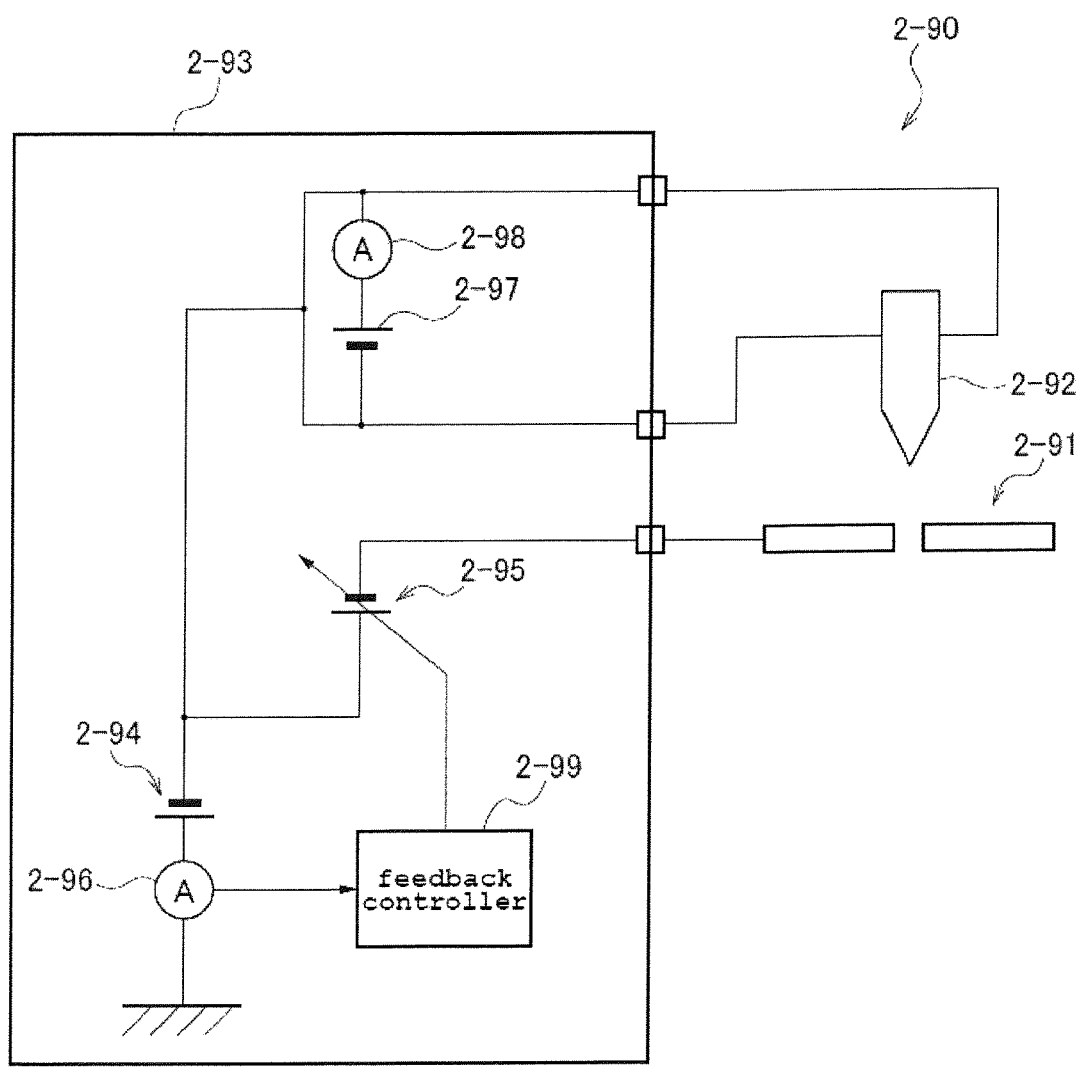
FIG. 22 is an explanatory drawing showing a schematic configuration of an electron source.

FIG. 22 shows a schematic configuration of the electron source 2-90 for execution of the feedback control. The electron source 2-90 includes a Wehnelt 2-91, a filament 2-92, and a power source module 2-93. The power source module 2-93 includes an acceleration power source 2-94, a Wehnelt power source 2-95, a heat current source 2-97, a filament current meter 2-98, an emission current meter 2-96, and a feedback controller 2-99. The filament 2-92 is heated by being energized with a current from the heat current source 2-97, and as a result of this, it is easy for thermoelectrons to be emitted from the filament 2-92. The filament current meter 2-98 measures an amount of current which actually flows to the filament 2-92. Thermoelectrons are accelerated by the voltage of the acceleration power source 2-94 to thereby be emitted as an electron beam, and the amount of electrons to be emitted is controlled by a voltage applied to the Wehnelt 2-91.

An amount of electrons emitted from the filament 2-92 (an emission current value) is detected by the emission current meter 2-96. The current value detected by the emission current meter 2-96 is inputted into the feedback controller 2-99. The feedback controller 2-99 executes the feedback control so that the emission current value is maintained at a target value by controlling the Wehnelt power source 2-95 based on the emission current value inputted to control the voltage value applied to the Wehnelt 2-91.

In this embodiment, the correction process is executed by the following expression (3). IV0 denotes an integrated detection amount before correction process, and IV1 is an integrated detection amount after correction process. K denotes a correction coefficient which is calculated by the following expression (4). A0 denotes a target value of the emission current value. An (n is an integer of 1 or larger) denotes an emission current value that is detected by the emission current meter 2-96 (hereinafter, also referred to as an actual emission current value).

$$IV1 = K \times IV0 \quad (3)$$

$$K = A0/An \quad (4)$$

The target value A0 is set by the user so that an inspection image has a desired luminance. The target value A0 may be stored in advance in the image processing unit 2-80 or may be set by the user by controlling the luminance at the time of inspection. In this embodiment, the actual emission current value An is a characteristic amount (here, a simple mean value) of the emission current value that is detected by the emission current meter 2-96 during a period of time Tn during which amounts of secondary charged particles are integrated by the TDI sensor 2-75 by the number of stages aligned in the TDI sensor 2-75 in the direction Y.

As is obvious from the expressions (3), (4) above, in the correction process, when the actual emission current value An is smaller than the target value A0, the results of the imaging by the TDI sensor 2-75 are corrected so that the luminance value of the imaging results is increased. On the other hand, when the actual emission current value An is larger than the target value A0, the results of the imaging by the TDI sensor 2-75 are corrected so that the luminance value of the imaging results is decreased. In this embodiment, assuming that the emission current and the amount of secondary charged particles are in a proportional relationship, the correction coefficient K is set as in the expression (4) above. According to this configuration, based on the premise that the proportional relationship described above exists, the influence on the imaging results by the variation in the emission current value can be eliminated completely in relation to a mean value in a period of time Tn.

Figure 23:
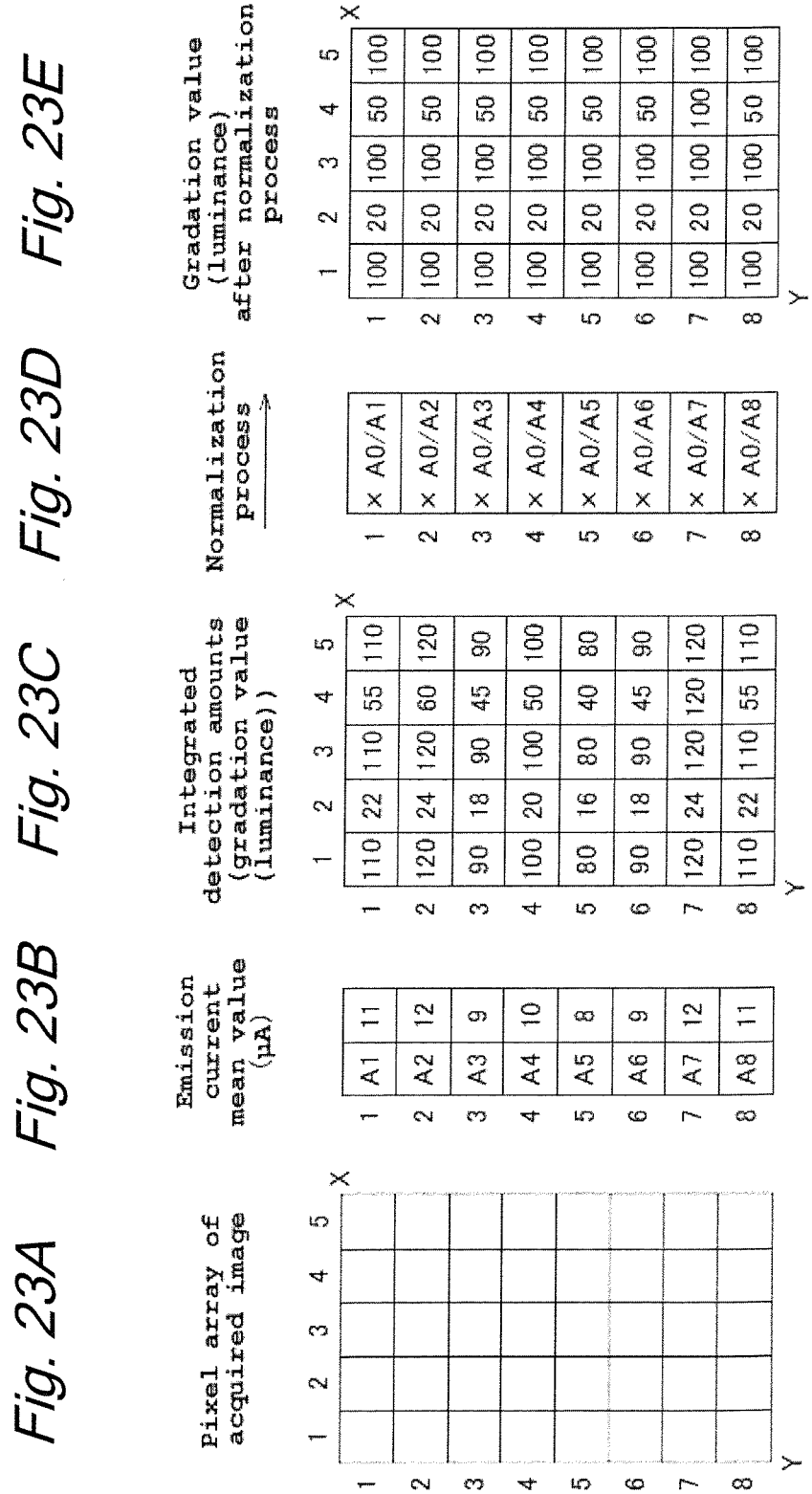
FIGS. 23A to 23E are explanatory drawings showing a specific example of a correction process applied to the results of imaging in the TDI sensor.

FIGS. 23A to 23E shows a specific example of a correction process that is executed on the imaging results of the TDI sensor 2-75. In this example, image data is first generated, and a correction process is executed thereafter. FIG. 23A shows a pixel array in the image data before the correction process. A pixel group of Y=1 is a pixel group which is transferred first to the image processing unit 2-80 by the TDI sensor 2-75. A pixel group of Y=2 is a pixel group which is transferred after the pixel group of Y=1. Namely, a row of numbers in the direction Y denotes the order in which the pixel groups are transferred from the TDI sensor 2-75. FIG. 23B shows actual emission current values An for periods of time Tn (n=1 to 8, in this example) arranged in the direction X. For example, an actual emission current value A1 is a mean value of actual emission current values in a period of time T1 (which corresponds, for example, to the times T11 to T15 shown in FIG. 12). FIG. 23C shows gradation values of the individual pixels which make up the image data generated by synthesizing the integrated detection values. Namely, FIG. 23C shows the integrated detection amounts IV0 before correction process. The integrated detection amounts (the gradation values) IV0 before normalization are luminance values of 256 gradations here. FIG. 23D shows correction coefficients K which are applied to a pixel group of Y=n. FIG. 23E shows integrated detection values IV1 after normalization which are calculated by the expression (4) based on the correction coefficients K shown in FIG. 23D.

Figure 24:
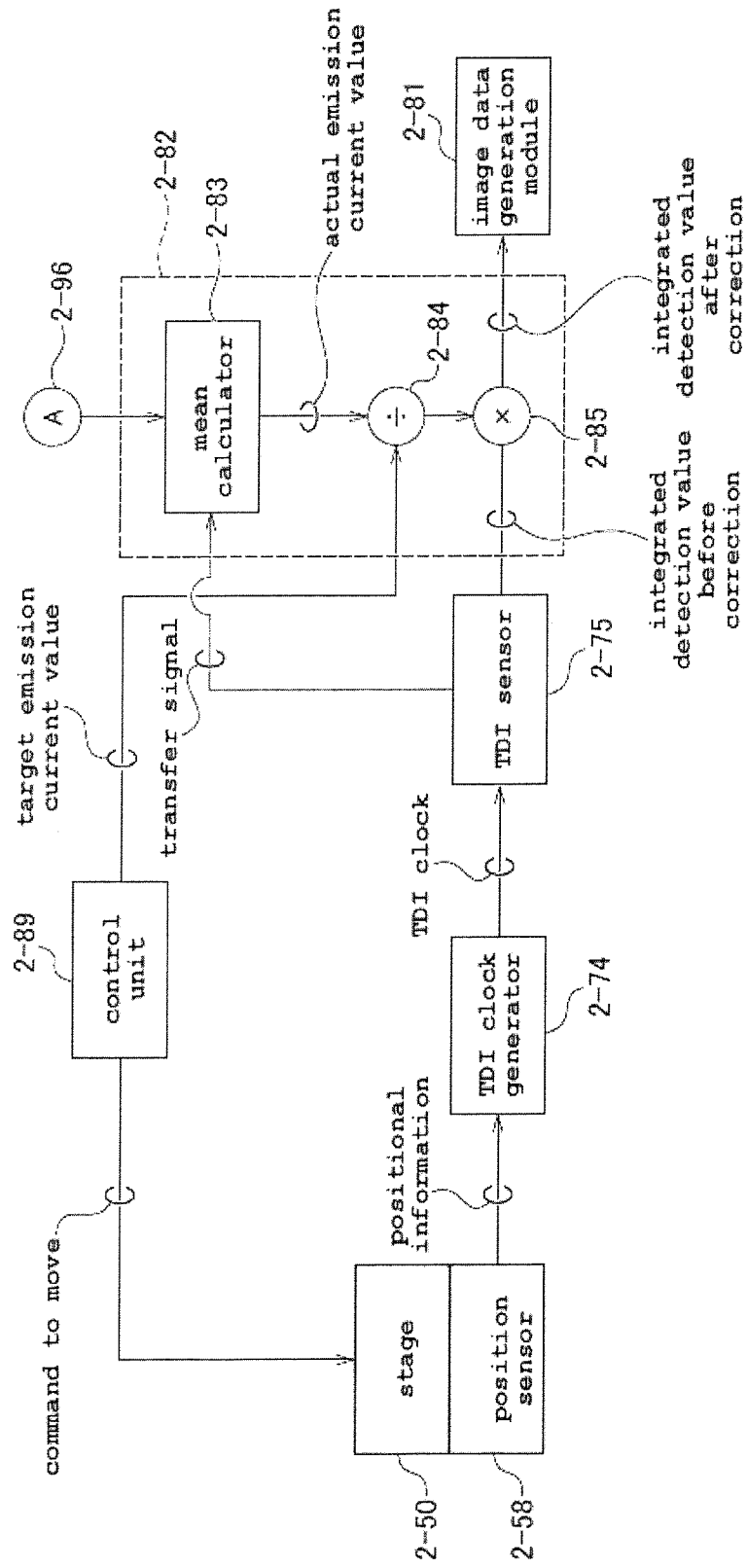
FIG. 24 is a block diagram showing an example of a configuration for executing the correction process.

FIG. 24 shows an example of a configuration for realizing the correction process described above. The example shown is a configuration in which image data is generated after a correction process. As shown in FIG. 24, the correction module 2-82 includes a mean calculator 2-83, a divider 2-84, and a multiplier 2-85. When the control unit 2-89 issues a moving command to a stage unit 2-50 (a servo motor 2-56), a Y table 2-52 is moved in the direction Y. A moving amount of the Y table 2-52 is detected by a position sensor 2-58. Then, the positional information detected by the position sensor 2-58 is inputted into a TDI clock generator 2-74. The TDI clock generator 2-74 inputs a TDI clock (a transfer clock) into the TDI sensor 2-75 based on the positional information received every time the Y table 2-52 moves one pixel in the direction Y. The TDI sensor 2-57 integrates electric charges in accordance with the TDI clocks and transfers the electric charges which are integrated to a final stage to an A/D conversion module (not shown) incorporated therein. The integrated detection values IV0 before correction process which are converted to digital values by the A/D conversion module are inputted into the multiplier 2-85. Additionally, the TDI sensor 1-75 inputs a transfer signal that signals that the transfer has been executed into the mean calculator 2-83 every time the amount of secondary charged particles (electric charges) is transferred.

On the other hand, in the correction module 2-82, the mean calculator 2-83 calculates an actual emission current value An by using the emission current value that is outputted from the emission current meter 96 via a sampling circuit (not shown). Specifically speaking, the mean calculator 2-83 calculates a mean value of the emission current values that are inputted during the time required to receive the transfer signal by a predetermined number of times (five times in the example shown in FIG. 12) in succession most recently, and the mean value so calculated, that is, the actual emission current value An is then inputted into the divider 2-84. The divider 2-84 calculates a correction coefficient K by the use of the expression (4) above based on a target value A0 that is inputted from the control unit 2-89 and the actual emission current value An which is inputted from the mean calculator 2-83. The correction coefficient K so calculated is inputted into the multiplier 2-85, and the correction process, that is, an arithmetic operation based on the expression (3) above is executed in the multiplier 2-85. The results of the arithmetic operation executed in the multiplier 2-85, that is, the integrated detection amount IV1 after correction process is inputted into the image data generation module 2-81.

Although not shown, when the image data generating module 2-81 synthesizes the data transferred from the TDI sensor 2-75 to generate image data, whereafter the correction module 2-82 corrects the generated image data, the correction module 2-82 can correct the image data as follows, for example. Firstly, the correction module 2-82 calculates actual emission current values An sequentially or calculates correction coefficients K sequentially as done in FIG. 24 and stores the actual emission current values An or the correction coefficients K so calculated in a buffer. Next, the correction module 2-82 extracts sequentially the data groups that the correction module 2-82 receives from the TDI sensor 2-75 in a single transfer from the image data generated by the image data generation module 2-81 in the order in which the correction module 2-82 receives the data groups from the TDI sensor 2-75. Then, the correction module 2-82 corrects the data groups so extracted.

According to the inspection system 2-5 that has been described above, the correction process is executed in which the imaging results of the TDI sensor 2-75 or the image data is corrected based on the actual emission current values An. Therefore, even though the emission current value of the electron source 2-90 varies, it is possible to suppress the generation of unevenness in luminance that is caused in association with the variation in emission current. Moreover, since the correction process is executed based on the target value A0, it is possible to cause the luminance value of the image data generated to approach the desired level. More specifically, according to the inspection system 2-5, the correction module 2-82 corrects the imaging results or the image data so that the luminance value that the imaging results or the image data exhibits is increased in the event that the actual emission current value An is smaller than the target value A0. Consequently, in the event that the emission current value varies so as to be smaller than the target value A0, it is possible to suppress the generation of unevenness in luminance that is caused in association with the variation. In addition, according to the inspection system 2-5, the correction module 2-82 corrects the imaging results or the image data so that the luminance value that the imaging results or the image data exhibits is decreased in the event that the actual emission current value An is larger than the target value A0. Consequently, in the event that the emission current value varies so as to be larger than the target value A0, it is possible to suppress the generation of unevenness in luminance that is caused in association with the variation. Although it is desirable that both the control that is executed when An>A0 and the control that is executed when An<A0 are executed, only either of those controls may be executed. For example, when the characteristics of the electron optical unit 2-70 are generated partially based on either of the phenomena of An>A0 and An<A0, only either of the controls may be executed.

Further, according to the inspection system 2-5, the feedback control is executed based the extracted emission current value in such a way as to suppress the variation in emission current value, and the correction process is executed based on the emission control value that is feedback controlled. Consequently, it is possible to suppress further the generation of unevenness in luminance that cannot be eliminated completely by the feedback control only by executing the feedback control along with the correction process.

2-B. Modified Examples 2-B

2-B-1. Modified Example 2-B-1

The actual emission current value An may be a characteristic amount (for example, a mean value) of the emission current value that is detected by the emission current meter 2-96 during a period of time that is shorter than the period of time Tn during which the amounts of secondary charged particles are integrated by the TDI sensor 2-75 by the number of stages aligned in the TDI sensor 2-75 in the direction Y. For example, in the event that the number of stages aligned in the direction Y in the TDI sensor 2-75 is 2048, the actual emission current value An may be a mean value of emission current values available during a period of time during which amounts of secondary charged particles are integrated by 2000 stages. According to this configuration, it is possible to enhance the image data generation speed without influencing largely the accuracy of the correction process.

2-B-2. Modified Example 2-B-2

The imaging unit that detects the amount of secondary charged particles is not limited to the TDI sensor 2-75, and hence, an arbitrary imaging unit may be adopted which includes, for example, an EB (Electron Bombardment)-CCD, I (Intensified)-CCD or the like.

2-B-3. Modified Example 2-B-3

The correction system used in the correction process is not limited to those described in the embodiment and the modified examples that have been described above. For example, the correction coefficient K may be an arbitrary function which uses the actual emission current value An and the target value A0 as variables. As this occurs, in the function, a correlation between the emission current value and the amount of secondary charged particles may be grasped and set experimentally. The target value A0 does not necessarily have to be used in execution of the correction process, and hence, the correction process may be executed based only on the actual emission current value An so that the influence on the image data that is attributed to the variation in emission current value, that is, the variation in luminance value is mitigated. For example, a mean value Aav of emission current values that are detected in the process of detecting secondary charged particles for each pixel of image data (or for each image data of imaging results) may be calculated from those emission current values so as to calculate a correction coefficient K by the following expression (5). According to this configuration, too, the variation in emission current value is made uniform, and therefore, it is possible to suppress the generation of unevenness in luminance in the image data.

$$K = Aav/An \qquad (5)$$

Thus, while the embodiments of the invention have been described heretofore, the embodiments of the invention are intended to facilitate the understanding of the invention, and hence, the invention is not at all limited by or to those embodiments. The invention can be modified or improved variously without departing from the spirit and scope thereof, and equivalents thereof are, of course, included in the invention. In addition, constituent elements that are described in claims and the specification may be combined or omitted arbitrarily within the scope where at least part of the problems described above can be solved or the scope where at least part of the advantages described above can be provided.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims and equivalents.

This patent application is based on and claims the benefit of priority from Japanese Patent Application No. 2013-166141 filed on Aug. 9, 2013 and Japanese Patent Application No. 2013-198161 filed on Sep. 25, 2013, the entire contents of which are incorporated herein by reference.

What is claimed is:

1. An inspection system comprising:
a primary optical system that has an electron source that irradiates charged particles in the form of a beam;
a current detection unit that detects an emission current value of the beam irradiated from the electron source;
an imaging unit that has an imaging element that detects an amount of secondary charged particles that are obtained by irradiating the beam on to an inspection target;
an image data generation unit that generates image data based on the results of the imaging by the imaging unit;
a correction unit that corrects the results of the imaging or the image data based on the emission current value so detected; and
a movable unit that can hold an inspection target to move the inspection target through a position where the beam is irradiated by the primary optical system, in a predetermined direction, wherein
the imaging unit comprises a TDI sensor having imaging elements that are aligned in the predetermined number of stages in a predetermined direction and configured to integrate amounts of secondary charged particles that are obtained by irradiating the beam on to the inspection target while moving the movable unit in the predetermined direction, through a time delay integration system along a predetermined direction, and
the correction unit corrects, based on a mean value of emission current values that are detected by the current detection unit during a period of integration during which amounts of secondary charged particles are integrated by the number of stages by the TDI sensor, the results of the imaging or the image data corresponding to the amounts of secondary charged particles that are integrated during the period of integration.

2. The inspection system according to claim 1, wherein the correction unit executes a correction so as to increase a luminance value that the results of the imaging or the image data exhibits in the event that the detected emission current value is smaller than the target value.

3. The inspection system according to claim 1, wherein the correction unit executes a correction so as to decrease a luminance value that the results of the imaging or the image data exhibits in the event that the detected emission current value is larger than the target value.

4. The inspection system according to claim 1, comprising further:
a feedback control unit that executes a feedback control based on the detected emission current value so that the variation in emission current value is suppressed.

5. The inspection system according to claim 1, wherein the correction unit executes the correction based on a predetermined target emission current value and the detected emission current value.

* * * * *